(12) United States Patent
Li et al.

(10) Patent No.: US 12,048,216 B2
(45) Date of Patent: Jul. 23, 2024

(54) ARRAY SUBSTRATE AND DISPLAY APPARATUS

(71) Applicant: BOE Technology Group Co., Ltd., Beijing (CN)

(72) Inventors: Mei Li, Beijing (CN); Tian Dong, Beijing (CN); Li Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 413 days.

(21) Appl. No.: 17/428,629

(22) PCT Filed: Oct. 22, 2020

(86) PCT No.: PCT/CN2020/122820
§ 371 (c)(1),
(2) Date: Aug. 5, 2021

(87) PCT Pub. No.: WO2022/082596
PCT Pub. Date: Apr. 28, 2022

(65) Prior Publication Data
US 2022/0302219 A1   Sep. 22, 2022

(51) Int. Cl.
*H10K 59/13* (2023.01)
*H10K 59/121* (2023.01)
*H10K 59/131* (2023.01)
*H10K 59/35* (2023.01)

(52) U.S. Cl.
CPC ....... *H10K 59/353* (2023.02); *H10K 59/1216* (2023.02); *H10K 59/131* (2023.02); *H10K 59/351* (2023.02); *H10K 59/352* (2023.02); *G09G 2300/0426* (2013.01); *G09G 2310/0205* (2013.01)

(58) Field of Classification Search
None
See application file for complete search history.

(56) References Cited

U.S. PATENT DOCUMENTS

2010/0265410 A1* 10/2010 Sugihara .............. G09G 3/3648
   348/731
2014/0071178 A1   3/2014 Zhang et al.
(Continued)

FOREIGN PATENT DOCUMENTS

CN   103163697 A   6/2013
CN   107275368 A   10/2017
(Continued)

OTHER PUBLICATIONS

International Search Report & Written Opinion mailed Jul. 21, 2021, regarding PCT/CN2020/122820.

*Primary Examiner* — Joseph R Haley
(74) *Attorney, Agent, or Firm* — Intellectual Valley Law, P.C.

(57) ABSTRACT

An array substrate is provided. The array substrate includes a plurality of subpixels arranged in an array comprising M rows and N columns. The array substrate includes a respective first subpixel in a (2n−1)-th column and in a (2m−1)-th row; a respective second subpixel in a (2n−1)-th column and in a (2m)-th row; a respective third subpixel in a (2n)-th column and in a (2m)-th row; and a respective fourth subpixel in a (2n)-th column and in a (2m−1)-th row.

18 Claims, 19 Drawing Sheets

(56) References Cited

U.S. PATENT DOCUMENTS

| | | | |
|---|---|---|---|
| 2015/0379947 A1* | 12/2015 | Sang | G09G 3/3607 |
| | | | 349/37 |
| 2017/0040407 A1 | 2/2017 | Shin et al. | |
| 2017/0263170 A1 | 9/2017 | Mu | |
| 2017/0287996 A1 | 10/2017 | Kim et al. | |
| 2019/0325186 A1 | 10/2019 | Gao et al. | |

FOREIGN PATENT DOCUMENTS

| | | |
|---|---|---|
| CN | 110286537 A | 9/2019 |
| CN | 110320719 A | 10/2019 |
| KR | 20170018197 A | 2/2017 |
| KR | 20180003721 A | 1/2018 |
| KR | 20190083582 A | 7/2019 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2020/122820, filed Oct. 22, 2020, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness SUMMARY In one aspect, the present disclosure provides an array substrate, comprising a plurality of subpixels arranged in an array comprising M rows and N columns; wherein the array substrate comprises a plurality of first gate lines; a plurality of second gate lines; a plurality of third gate lines; a plurality of fourth gate lines; a plurality of first data lines, a plurality of second data lines; a plurality of third data lines; and a plurality of fourth data lines; wherein a respective first gate line of the plurality of first gate lines is configured to provide gate driving signals to subpixels in a (2n−1)-th column, $1 \le n \le N/2$ and in a (2m−1)-th row, $1 \le m \le M/2$; a respective second gate line of the plurality of second gate lines is configured to provide gate driving signals to subpixels in the (2n−1)-th column and in a (2m)-th row; a respective third gate line of the plurality of third gate lines is configured to provide gate driving signals to subpixels in a (2n)-th column and in the (2m)-th row; a respective fourth gate line of the plurality of fourth gate lines is configured to provide gate driving signals to subpixels in a (2n)-th column and in the (2m−1)-th row; a respective first data line of the plurality of first data lines is configured to provide data voltage signals to subpixels in the (2n−1)-th column and in the (2m−1)-th row; a respective second data line of the plurality of second data lines is configured to provide data voltage signals to subpixels in the (2n−1)-th column and in the (2m)-th row; a respective third data line of the plurality of third data lines is configured to provide data voltage signals to subpixels in the (2n)-th column and in the (2m)-th row; and a respective fourth data line of the plurality of fourth data lines is configured to provide data voltage signals to subpixels in the (2n)-th column and in a (2m−1)-th row; wherein the plurality of subpixels comprise a respective first subpixel in the (2n−1)-th column and in the (2m−1)-th row; a respective second subpixel in the (2n−1)-th column and in the (2m)-th row; a respective third subpixel in the (2n)-th column and in the (2m)-th row; and a respective fourth subpixel in the (2n)-th column and in the (2m−1)-th row.

Optionally, the second respective gate line and the third respective gate line are between the respective first subpixel and the respective second subpixel, and between the respective third subpixel and the respective fourth subpixel; the first respective gate line and the fourth respective gate line are spaced apart from the second respective gate line and the third respective gate line by the respective first subpixel, and by the respective fourth subpixel; the respective second data line and the respective third data line are between the respective first subpixel and the respective fourth subpixel, and between the respective second subpixel and the respective third subpixel; the respective first data line is spaced apart from the respective second data line and the respective third data line by the respective first subpixel, and by the respective second subpixel; and the respective fourth data line is spaced apart from the respective second data line and the respective third data line by the respective third subpixel, and by the respective fourth subpixel.

Optionally, the array substrate further comprises a respective first subpixel gate line in the respective first subpixel and electrically connected to the respective first gate line; a respective second subpixel gate line in the respective second subpixel and electrically connected to the respective second gate line; a respective third subpixel gate line in the respective third subpixel and electrically connected to the respective third gate line; and a respective fourth subpixel gate line in the respective fourth subpixel and electrically connected to the respective fourth gate line.

Optionally, the array substrate further comprises a first gate insulating layer and a second gate insulating layer; wherein the respective first subpixel gate line, the respective second subpixel gate line, the respective third subpixel gate line, and the respective fourth subpixel gate line are between the first gate insulating layer and the second gate insulating layer; and the respective first gate line, the respective second gate line, the respective third gate line, and the respective fourth gate line are on a side of the second gate insulating layer away from the respective first subpixel gate line, the respective second subpixel gate line, the respective third subpixel gate line, and the respective fourth subpixel gate line.

Optionally, a respective pixel driving circuit of a plurality of pixel driving circuit of the array substrate comprises a storage capacitor; the storage capacitor comprises a first capacitor electrode in a same layer as the respective first subpixel gate line, the respective second subpixel gate line, the respective third subpixel gate line, and the respective fourth subpixel gate line; and a second capacitor electrode in a same layer as the respective first gate line, the respective second gate line, the respective third gate line, and the respective fourth gate line.

Optionally, the array substrate further comprises a respective first gate line connecting line extending into the respective first subpixel, and electrically connecting the respective first gate line and the respective first subpixel gate line; a respective second gate line connecting line extending into the respective second subpixel, and electrically connecting the respective second gate line and the respective second subpixel gate line; a respective third gate line connecting line extending into the respective third subpixel, and electrically connecting the respective third gate line and the respective third subpixel gate line; and a respective fourth gate line connecting line extending into the respective fourth subpixel, and electrically connecting the respective fourth gate line and the respective fourth subpixel gate line.

Optionally, the array substrate further comprises a first gate insulating layer, a second gate insulating layer, and an inter-layer dielectric layer; wherein the respective first subpixel gate line, the respective second subpixel gate line, the respective third subpixel gate line, and the respective fourth subpixel gate line are between the first gate insulating layer and the second gate insulating layer; the respective first gate line, the respective second gate line, the respective third gate line, and the respective fourth gate line are on a side of the second gate insulating layer away from the respective first subpixel gate line, the respective second subpixel gate line, the respective third subpixel gate line, and the respective fourth subpixel gate line; and the respective first gate line connecting line, the respective second gate line connecting line, the respective third gate line connecting line, and the respective fourth gate line connecting line are on a side of the inter-layer dielectric layer away from the respective first gate line, the respective second gate line, the respective third gate line, and the respective fourth gate line.

Optionally, a respective one of the plurality of subpixels further comprises a first connecting line electrically connected to the first capacitor electrode through a hole in the second capacitor electrode, and electrically connected to a semiconductor material layer comprising a part of a respective pixel driving circuit of a plurality of pixel driving circuit.

Optionally, a respective pixel driving circuit of a plurality of pixel driving circuit of the array substrate comprises a storage capacitor comprising a first capacitor electrode and a second capacitor electrode; an orthographic projection of the second capacitor electrode on a base substrate completely covers, with a margin, an orthographic projection of the first capacitor electrode on the base substrate except for a hole region in which a portion of the second capacitor electrode is absent; the array substrate further comprises a first gate insulating layer, a second gate insulating layer, and an inter-layer dielectric layer; the first capacitor electrode is between the first gate insulating layer and the second gate insulating layer; the second capacitor electrode is between the second gate insulating layer and the inter-layer dielectric layer; and the first connecting line is on a side of the inter-layer dielectric layer away from the second capacitor electrode; wherein the array substrate further comprises a first via in the hole region and extending through the inter-layer dielectric layer and the second gate insulating layer; and a second via extending through the inter-layer dielectric layer, the second gate insulating layer, and the first gate insulating layer; wherein the first connecting line is connected to the first capacitor electrode through the first via; and the first connecting line is connected to a semiconductor material layer through the second via.

Optionally, the respective pixel driving circuit of a plurality of pixel driving circuit comprises a driving transistor; a first transistor; a second transistor; a third transistor; a fourth transistor; a fifth transistor; and a sixth transistor; wherein a source electrode of the third transistor, an active layer of the third transistor, a drain electrode of the third transistor, a source electrode of the first transistor, an active layer of the first transistor, a drain electrode of the first transistor are parts of a unitary structure in the respective one of the plurality of subpixels; and the first connecting line is connected to the source electrode of the third transistor and the drain electrode of the first transistor through the second via.

Optionally, the respective one of the plurality of subpixels further comprises a first planarization layer on the first connecting line, and a first interference preventing block on a side of the first planarization layer away from the first connecting line; an orthographic projection of the first interference preventing block on a base substrate is at least partially overlapping with an orthographic projection of the first connecting line on the base substrate; and the first interference preventing block is electrically connected to an anode of a respective light emitting element in the respective one of the plurality of subpixels, and electrically connected to the semiconductor material layer.

Optionally, the respective pixel driving circuit of a plurality of pixel driving circuit comprises a driving transistor; a first transistor; a second transistor; a third transistor; a fourth transistor; a fifth transistor; and a sixth transistor; wherein a source electrode of the third transistor is electrically connected to the second capacitor electrode through a first connecting line, and electrically connected to a drain electrode of the first transistor; and the orthographic projection of the first interference preventing block on the base substrate is at least partially overlapping with an orthographic projection of the source electrode of the third transistor on the base substrate.

Optionally, the respective one of the plurality of subpixels further comprises a second connecting line electrically connecting the first interference preventing block and the semiconductor material layer; the first connecting line and the second connecting line are in a same layer; the first interference preventing block is electrically connected to the second connecting line through a third via extending through the first planarization layer; the array substrate further comprises a first gate insulating layer, a second gate insulating layer, and an inter-layer dielectric layer; and the second connecting line is electrically connected to the semiconductor material layer through a fourth via extending through the inter-layer dielectric layer, the second gate insulating layer, and the first gate insulating layer.

Optionally, the respective pixel driving circuit of a plurality of pixel driving circuit comprises a driving transistor; a first transistor; a second transistor; a third transistor; a fourth transistor; a fifth transistor; and a sixth transistor; wherein a source electrode of the fifth transistor, an active layer of the fifth transistor, a drain electrode of the fifth transistor, a source electrode of the sixth transistor, an active layer of the sixth transistor, a drain electrode of the sixth transistor are parts of a unitary structure in the respective one of the plurality of subpixels; and the second connecting line is electrically connected to the drain electrode of the fifth transistor and the drain electrode of the sixth transistor through the fourth via.

Optionally, a respective one of the plurality of subpixels further comprises a third connecting line electrically connecting a reset signal line to the semiconductor material layer.

Optionally, the array substrate further comprises a first gate insulating layer on the semiconductor material layer; a second gate insulating layer on the first gate insulating layer; and an inter-layer dielectric layer on a side of the second gate insulating layer away from the first gate insulating layer; wherein the third connecting line is on a side of the inter-layer dielectric layer away from the second gate insulating layer; the third connecting line is electrically connected to the semiconductor material layer though a fifth via extending through the inter-layer dielectric layer, the second gate insulating layer, and the first gate insulating layer.

Optionally, a respective pixel driving circuit of a plurality of pixel driving circuit comprises a driving transistor; a first transistor; a second transistor; a third transistor; a fourth transistor; a fifth transistor; and a sixth transistor; wherein the third connecting line is electrically connected to a source electrode of the sixth transistor; a gate electrode of the sixth transistor is connected to a reset control signal line; and a drain electrode of the sixth transistor is connected to an anode of a respective light emitting element in the respective one of the plurality of subpixels.

Optionally, the array substrate further comprises a plurality of first voltage supply lines and a plurality of second voltage supply lines configured to provide a power voltage signal to the plurality of subpixels; wherein the plurality of first voltage supply lines are in a same layer as the plurality of first data lines, the plurality of second data lines, the plurality of third data lines, and the plurality of fourth data lines; the plurality of first voltage supply lines and a plurality of second voltage supply lines are substantially parallel to each other; and an orthographic projection of a respective one of the plurality of first voltage supply lines on a base substrate is at least partially overlapping with an orthographic projection of a respective one of the plurality of second voltage supply lines on the base substrate; wherein the array substrate further comprises a first planarization layer between the respective one of the plurality of first voltage supply lines and the respective one of the plurality of second voltage supply lines on the base substrate; and the respective one of the plurality of first voltage supply lines is connected to the respective one of the plurality of second voltage supply lines through a via extending through the first planarization layer.

Optionally, a respective one of the plurality of subpixels further comprises a second interference preventing block configured to be provided with a power voltage signal, a respective pixel driving circuit of a plurality of pixel driving circuit of the array substrate comprises a storage capacitor comprising a first capacitor electrode and a second capacitor electrode; the second interference preventing block and the second capacitor electrode are in a same layer; and an orthographic projection of the second interference preventing block on a base substrate is at least partially overlapping with an orthographic projection of a semiconductor material layer comprising a part of a respective pixel driving circuit of a plurality of pixel driving circuit on the base substrate.

Optionally, the respective pixel driving circuit of a plurality of pixel driving circuit comprises a driving transistor; a first transistor; a second transistor; a third transistor; a fourth transistor; a fifth transistor; and a sixth transistor; wherein a source electrode of the third transistor is electrically connected to the second capacitor electrode through a first connecting line, and electrically connected to a drain electrode of the first transistor; and the orthographic projection of the second interference preventing block on the base substrate is at least partially overlapping with an orthographic projection of the source electrode of the third transistor on the base substrate.

Optionally, the array substrate further comprises a plurality of first voltage supply lines and a plurality of second voltage supply lines configured to provide the power voltage signal to the plurality of subpixels; an inter-layer dielectric layer between the plurality of second voltage supply lines and the second interference preventing block, and between the plurality of second voltage supply lines and the second capacitor electrode; and a first planarization layer between the plurality of second voltage supply lines and the plurality of first voltage supply lines; wherein a respective one of the plurality of second voltage supply lines is electrically connected to the second interference preventing block through a sixth via extending through the inter-layer dielectric layer.

Optionally, the respective one of the plurality of second voltage supply lines is electrically connected to the second capacitor electrode through a seventh via extending through the inter-layer dielectric layer.

Optionally, the array substrate further comprises a respective first data line extension protrusion protruding from the respective first data line into the respective first subpixel, and electrically connecting the respective first data line and a first pixel driving circuit in the respective first subpixel; a respective second data line extension protrusion protruding from the respective second data line into the respective second subpixel, and electrically connecting the respective second data line and a second pixel driving circuit in the respective second subpixel; a respective third data line extension protrusion protruding from the respective third data line into the respective third subpixel, and electrically connecting the respective third data line and a third pixel driving circuit in the respective third subpixel; and a respective fourth data line extension protrusion protruding from the respective fourth data line into the respective fourth subpixel, and electrically connecting the respective fourth data line and a fourth pixel driving circuit in the respective fourth subpixel.

Optionally, the respective first data line extension protrusion, the respective second data line extension protrusion, the respective third data line extension protrusion, and the respective fourth data line extension protrusion are in a same layer as the plurality of data lines; the array substrate further comprises a respective first relay electrode in the respective first subpixel; a respective second relay electrode in the respective second subpixel; a respective third relay electrode in the respective third subpixel; a respective fourth relay electrode in the respective fourth subpixel; and a first planarization layer between the plurality of data lines and the respective first relay electrode, the respective second relay electrode, the respective third relay electrode, and the respective fourth relay electrode; wherein the respective first relay electrode, the respective second relay electrode, the respective third relay electrode, and the respective fourth relay electrode are respectively connected to the respective first data line extension protrusion, the respective second data line extension protrusion, the respective third data line extension protrusion, and the respective fourth data line extension protrusion respectively through vias respectively extending through the first planarization layer; the respective first relay electrode electrically connects the respective first data line extension protrusion to a semiconductor material layer comprising a part of the first pixel driving circuit; the respective second relay electrode electrically connects the respective second data line extension protrusion to the semiconductor material layer; the respective third relay electrode electrically connects the respective third data line extension protrusion to the semiconductor material layer; the respective fourth relay electrode electrically connects the respective fourth data line extension protrusion to the semiconductor material layer.

Optionally, a respective pixel driving circuit of a plurality of pixel driving circuit comprises a driving transistor; a first transistor; a second transistor; a third transistor; a fourth transistor; a fifth transistor; and a sixth transistor; wherein the array substrate further comprises an inter-layer dielectric layer, a second gate insulating layer, and a first gate insulating layer between the semiconductor material layer and the respective first relay electrode, the respective second relay electrode, the respective third relay electrode, the respective fourth relay electrode; wherein the respective first relay electrode, the respective second relay electrode, the respective third relay electrode, and the respective fourth relay electrode are respectively connected to source electrodes of second transistors respectively in the first pixel driving circuit, the second pixel driving circuit, the third pixel driving circuit, and the fourth pixel driving circuit, respectively through vias respectively extending through the inter-layer dielectric layer, the second gate insulating layer, and the first gate insulating layer.

Optionally, the array substrate further comprises a plurality of first voltage supply lines and a plurality of second voltage supply lines configured to provide a power voltage signal to the plurality of subpixels; wherein the first planarization layer is between the plurality of second voltage supply lines and the plurality of first voltage supply lines, the plurality of first voltage supply lines are in a same layer as the plurality of data lines; and the plurality of second voltage supply lines are in a same layer as the respective first relay electrode, the respective second relay electrode, the respective third relay electrode, and the respective fourth relay electrode.

Optionally, the array substrate further comprises a plurality of reset signal lines in a same layer as the plurality of gate lines; wherein the respective second gate line and the respective third gate line are between a respective one of the plurality of reset signal lines and the respective first subpixel or the respective fourth subpixel.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
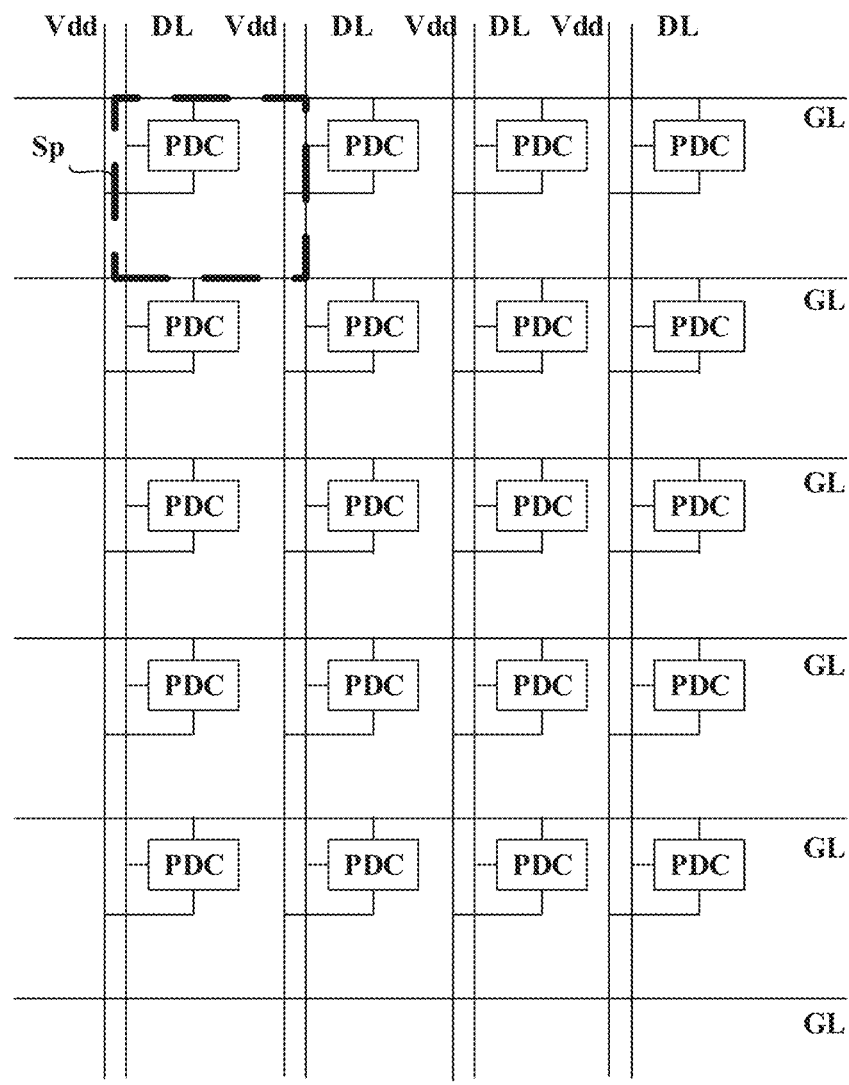
FIG. 1 is a plan view of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of subpixels arranged in an array comprising M rows and N columns. In some embodiments, the array substrate includes a plurality of first gate lines; a plurality of second gate lines; a plurality of third gate lines; a plurality of fourth gate lines; a plurality of first data lines, a plurality of second data lines; a plurality of third data lines; and a plurality of fourth data lines. Optionally, a respective first gate line of the plurality of first gate lines is configured to provide gate driving signals to subpixels in a (2n−1)-th column, $1 \leq n \leq N/2$ and in a (2m−1)-th row, $1 \leq m \leq M/2$. Optionally, a respective second gate line of the plurality of second gate lines is configured to provide gate driving signals to subpixels in the (2n−1)-th column and in a (2m)-th row. Optionally, a respective third gate line of the plurality of third gate lines is configured to provide gate driving signals to subpixels in a (2n)-th column and in the (2m)-th row. Optionally, a respective fourth gate line of the plurality of fourth gate lines is configured to provide gate driving signals to subpixels in a (2n)-th column and in the (2m−1)-th row. Optionally, a respective first data line of the plurality of first data lines is configured to provide data voltage signals to subpixels in the (2n−1)-th column and in the (2m−1)-th row. Optionally, a respective second data line of the plurality of second data lines is configured to provide data voltage signals to subpixels in the (2n−1)-th column and in the (2m)-th row. Optionally, a respective third data line of the plurality of third data lines is configured to provide data voltage signals to subpixels in the (2n)-th column and in the (2m)-th row. Optionally, a respective fourth data line of the plurality of fourth data lines is configured to provide data voltage signals to subpixels in the (2n)-th column and in a (2m−1)-th row. Optionally, the plurality of subpixels includes a respective first subpixel in the (2n−1)-th column and in the (2m−1)-th row; a respective second subpixel in the (2n−1)-th column and in the (2m)-th row; a respective third subpixel in the (2n)-th column and in the (2m)-th row; and a respective fourth subpixel in the (2n)-th column and in the (2m−1)-th row. M and N are even integer numbers greater than 2, e.g., greater than 50, greater than 100, greater than 200, or greater than 500.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a gate GL, a data line DL, a voltage supply line (e.g., a high voltage supply line Vdd), and a second voltage supply line (e.g., a low voltage supply line Vss), each of which electrically connected to the pixel driving circuit PDC. Light emission in a respective one of the subpixels Sp is driven by a pixel driving circuit PDC. In one example, a high voltage signal (e.g., a VDD signal) is input, through the high voltage support line Vdd, to the pixel driving circuit PDC connected to an anode of the light emitting element; a low voltage signal (e.g., a VSS signal) is input, through a low voltage supply line Vss, to a cathode of the light emitting element. A voltage difference between the high voltage signal (e.g., the VDD signal) and the low voltage signal (e.g., the VSS signal) is a driving voltage ΔV that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2:
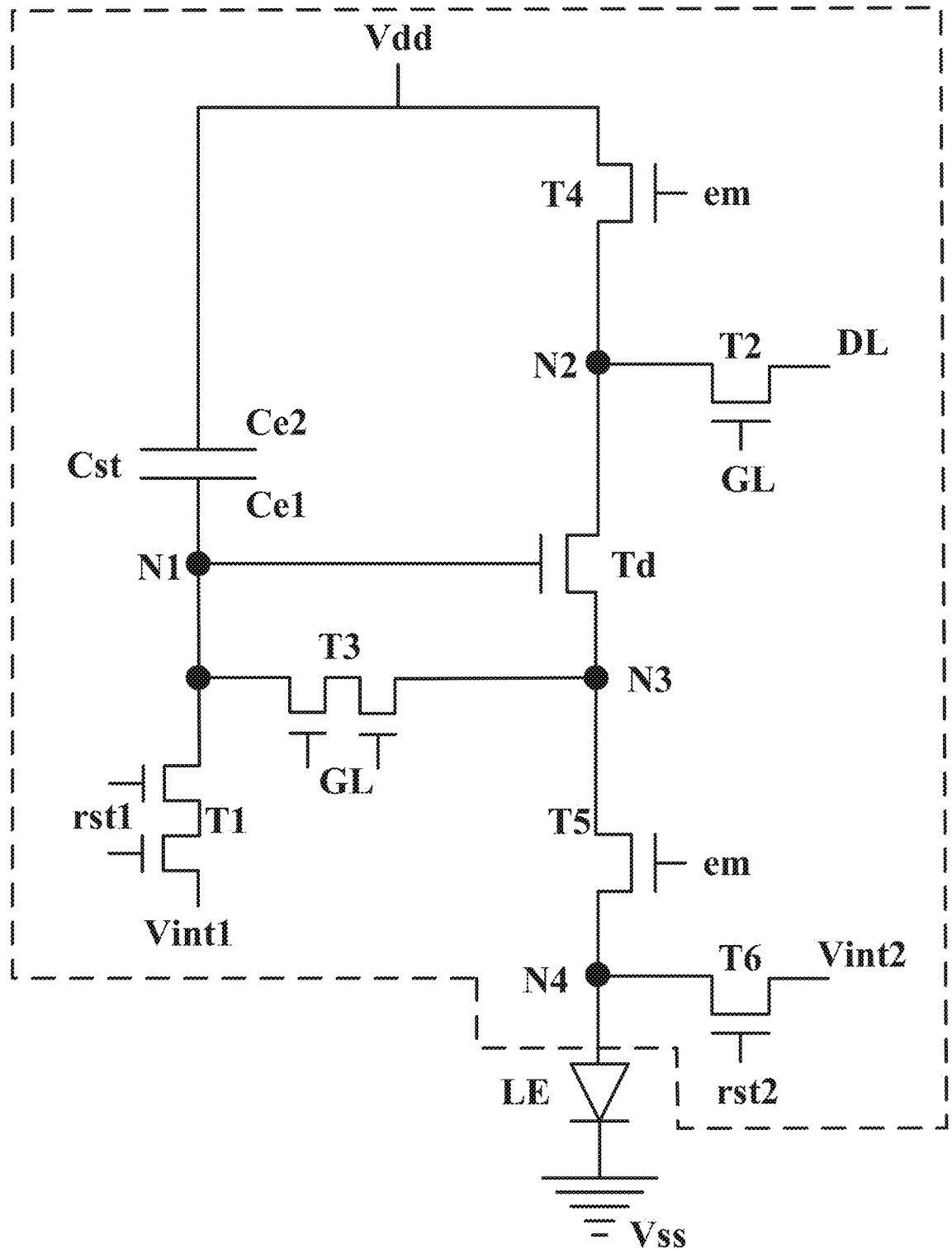
FIG. 2 is a circuit diagram illustrating the structure of a pixel driving circuit in some embodiments according to the present disclosure.

FIG. 2 is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a first reset control signal line rst1, a source electrode connected to a first reset signal line Vint1, and a drain electrode connected to a first capacitor electrode Ce1 of the storage capacitor Cst and a gate electrode of the driving transistor Td; a second transistor T2 having a gate electrode connected to a gate line GL, a source electrode connected to the data line DL, and a drain electrode connected to a source electrode of the driving transistor Td; a third transistor T3 having a gate electrode connected to the gate line GL, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a light emitting control signal line em, a source electrode connected to the voltage supply line Vdd, and a drain electrode connected to the source electrode of the driving transistor Td and the drain electrode of the second transistor T2; a fifth transistor T5 having a gate electrode connected to the light emitting control signal line em, a source electrode connected to drain electrodes of the driving transistor Td and the third transistor T3, and a drain electrode connected to an anode of a light emitting element LE; and a sixth transistor T6 having a gate electrode connected to a second reset control signal line rst2, a source electrode connected to a second reset signal line Vint2, and a drain electrode connected to the drain electrode of the fifth transistor and the anode of the light emitting element LE. The second capacitor electrode Ce2 is connected to the voltage supply line Vdd and the source electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

Figure 3A:
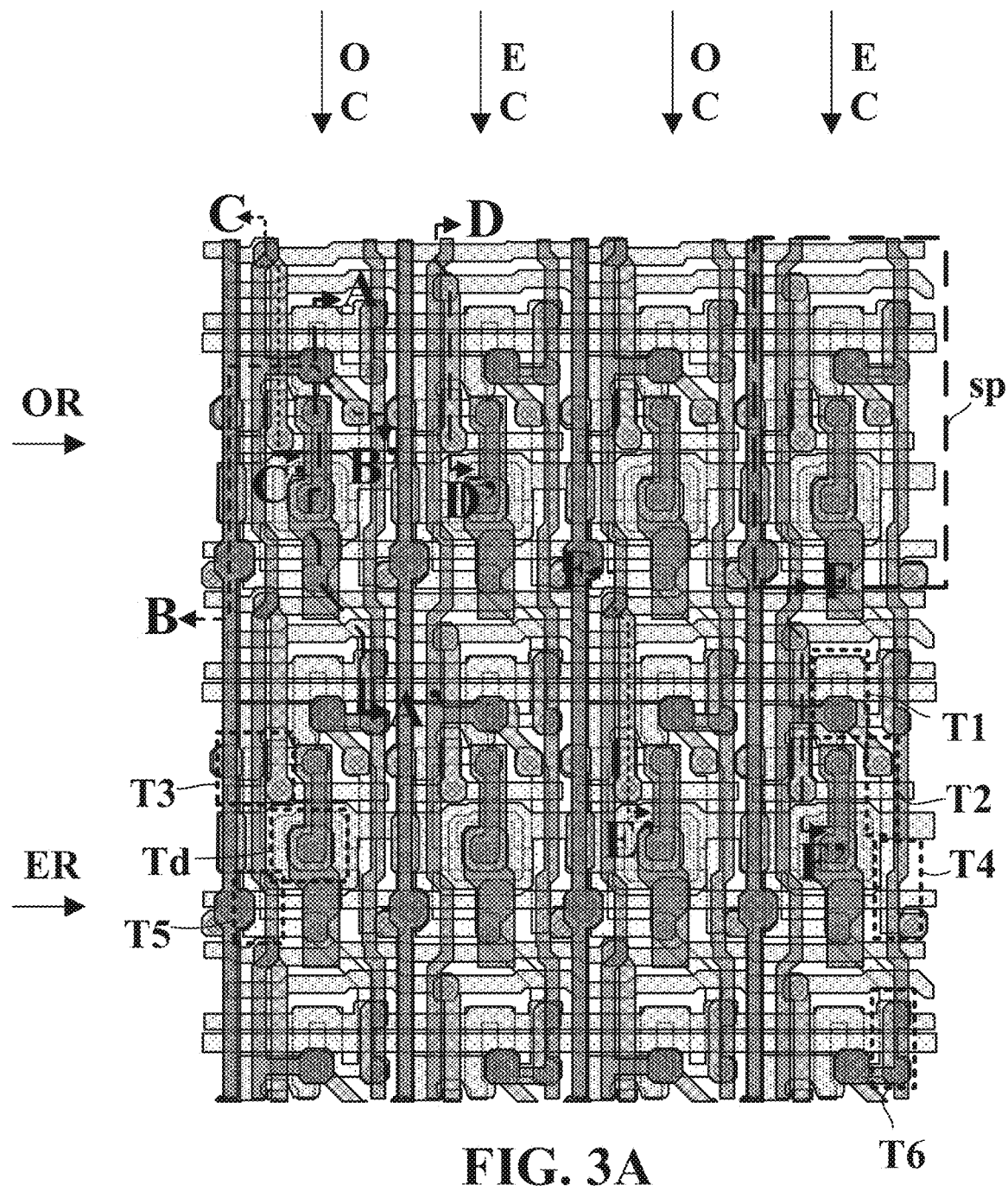
FIG. 3A is a diagram illustrating the structure of a plurality of subpixels of an array substrate in some embodiments according to the present disclosure.
Figure 3B:
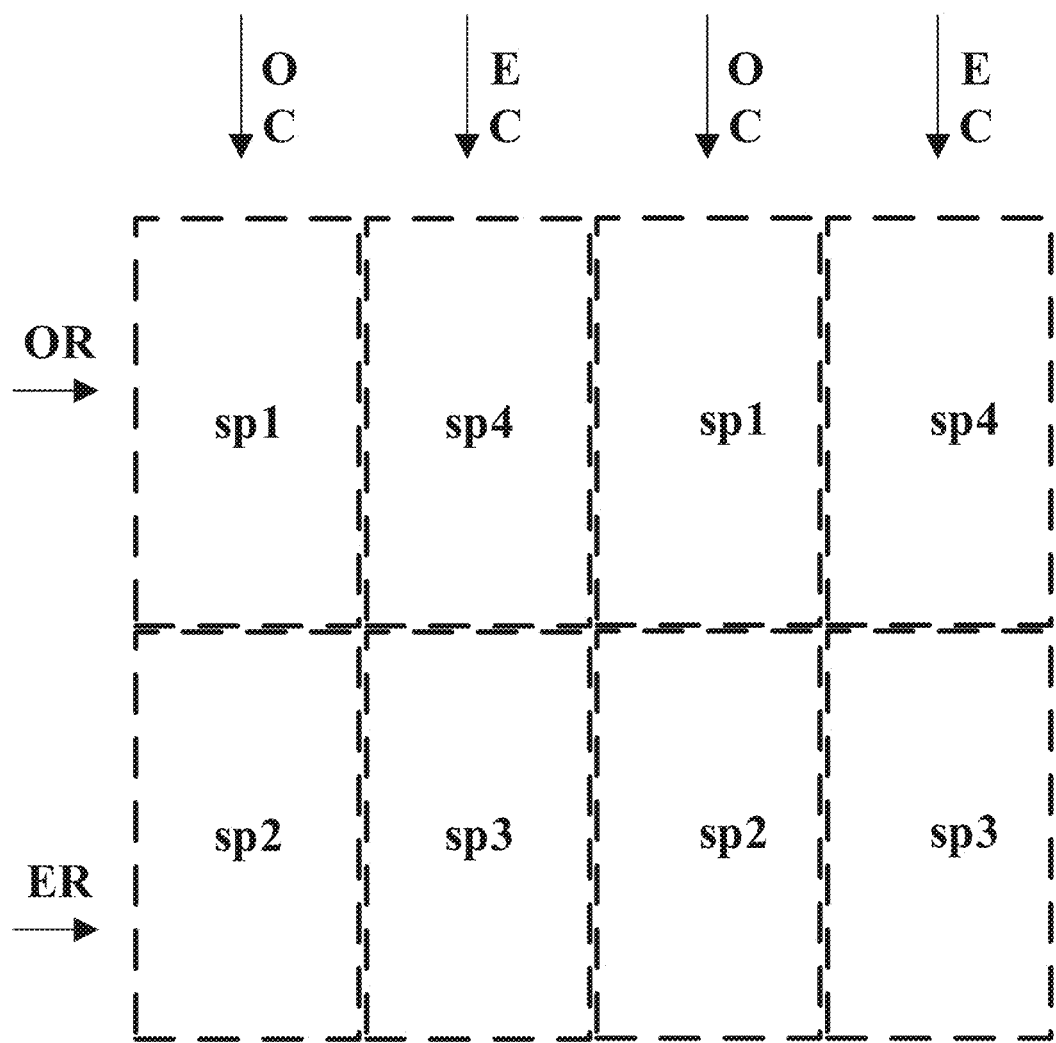
FIG. 3B is a schematic diagram illustrating a subpixel arrangement of a plurality of subpixels of an array substrate in an array substrate in some embodiments according to the present disclosure.

FIG. 3A is a diagram illustrating the structure of a plurality of subpixels of an array substrate in some embodiments according to the present disclosure. FIG. 3B is a schematic diagram illustrating a subpixel arrangement of a plurality of subpixels of an array substrate in an array substrate in some embodiments according to the present disclosure. Referring to FIG. 3A and FIG. 3B, the array substrate in some embodiments includes a plurality of subpixels. In some embodiments, the plurality of subpixels includes a respective first subpixel sp1, a respective second subpixel sp2, a respective third subpixel sp3, and a respective fourth subpixel sp4. The plurality of subpixels in the array substrate are arranged in an array. In one example, the array of the plurality of subpixels includes a S1-S2-S3-S4 format repeating array, in which S1 stands for the respective first subpixel sp1, S2 stands for the respective second subpixel sp2, S3 stands for the respective third subpixel sp3, and S4 stands for the respective fourth subpixel sp4. In another example, the S1-S2-S3-S4 format is a C1-C2-C3-C4 format, in which C1 stands for the respective first subpixel sp1 of a first color, C2 stands for the respective second subpixel sp2 of a second color, C3 stands for the respective third subpixel sp3 of a third color, and C4 stands for the respective fourth subpixel sp4 of a fourth color. In another example, the S1-S2-S3-S4 format is a C1-C2-C3-C2' format, in which C1 stands for the respective first subpixel sp1 of a first color, C2 stands for the respective second subpixel sp2 of a second color, C3 stands for the respective third subpixel sp3 of a third color, and C2' stands for the respective fourth subpixel sp4 of the second color. In another example, the C1-C2-C3-C2' format is a R-G-B-G format, in which the respective first subpixel sp1 is a red subpixel, the respective second subpixel sp2 is a green subpixel, the respective third subpixel sp3 is a blue subpixel, and the respective fourth subpixel sp4 is a green subpixel.

As depicted in FIG. 3A and FIG. 3B, in some embodiments, a minimum repeating unit of the plurality of subpixels of the array substrate includes the respective first subpixel sp1, the respective second subpixel sp2, the respective third subpixel sp3, and the respective fourth subpixel sp4. In FIG. 3A, a respective one of the plurality of subpixels sp is shown, and corresponding positions of the plurality of transistors in the pixel driving circuit depicted in FIG. 2 are annotated (for convenience, separately in different subpixels). FIG. 3A shows a total of eight subpixels of the plurality of subpixels sp arranged adjacent to each other. Each of the respective first subpixel sp1, the respective second subpixel sp2, the respective third subpixel sp3, and the respective fourth subpixel sp4, includes the first transistor T1, the second transistor T2, the third transistor T3, the fourth transistor T4, the fifth transistor T5, the sixth transistor T6, and the driving transistor Td.

Figure 4:
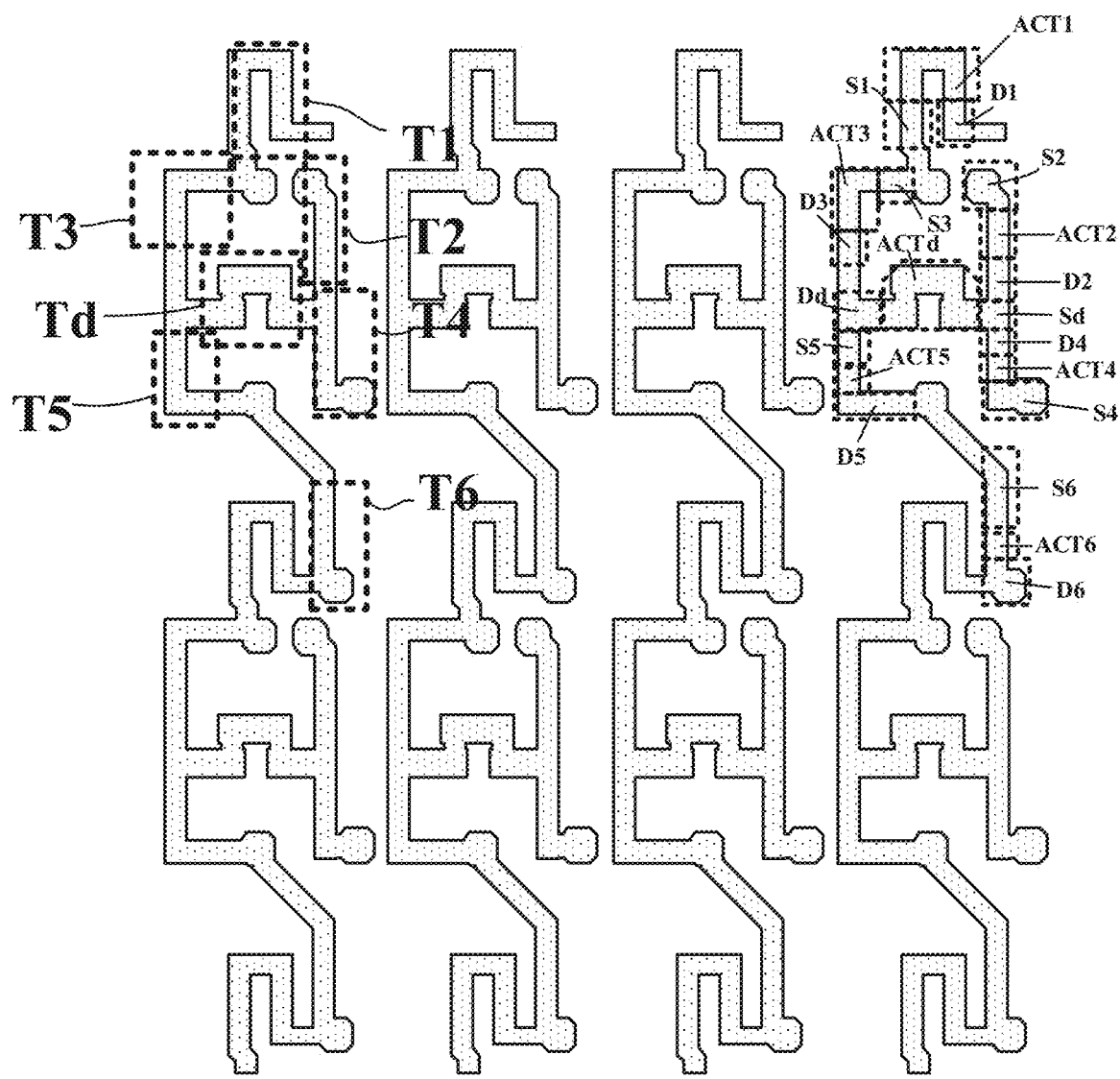
FIG. 4 is a diagram illustrating the structure of a semiconductor material layer in a plurality of subpixels of an array substrate depicted in FIG. 3A.
Figure 5:
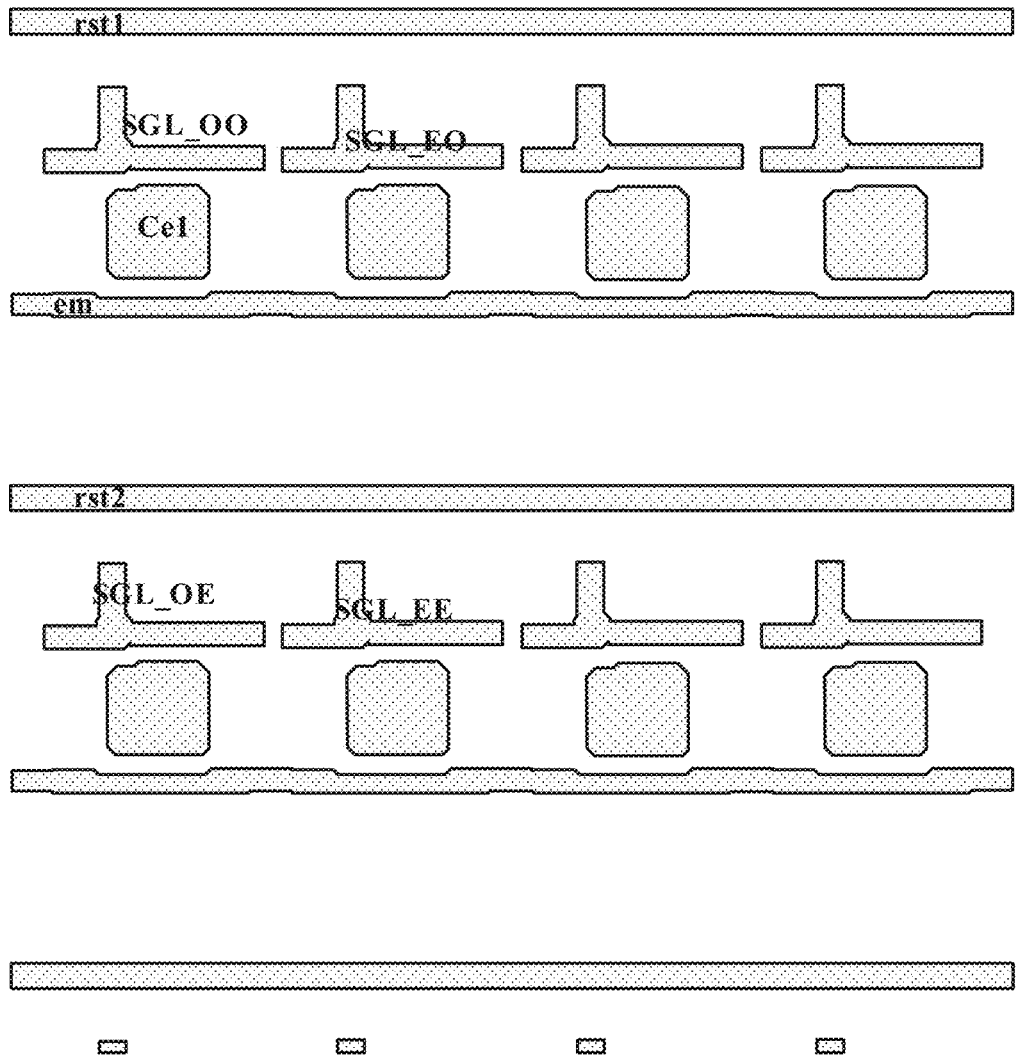
FIG. 5 is a diagram illustrating the structure of a first conductive layer in a plurality of subpixels of an array substrate depicted in FIG. 3A.
Figure 6:
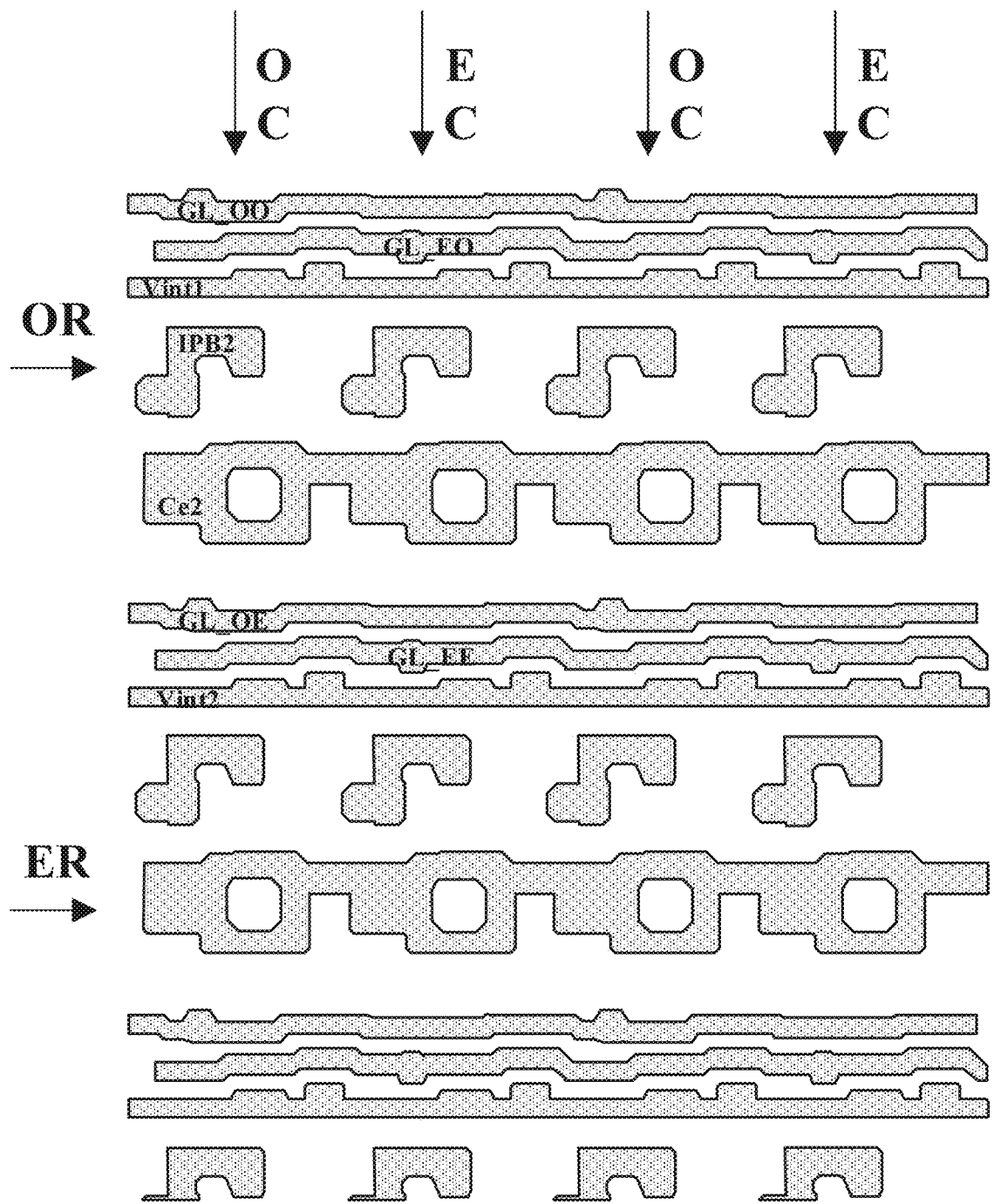
FIG. 6 is a diagram illustrating the structure of a second conductive layer in a plurality of subpixels of an array substrate depicted in FIG. 3A.
Figure 7:
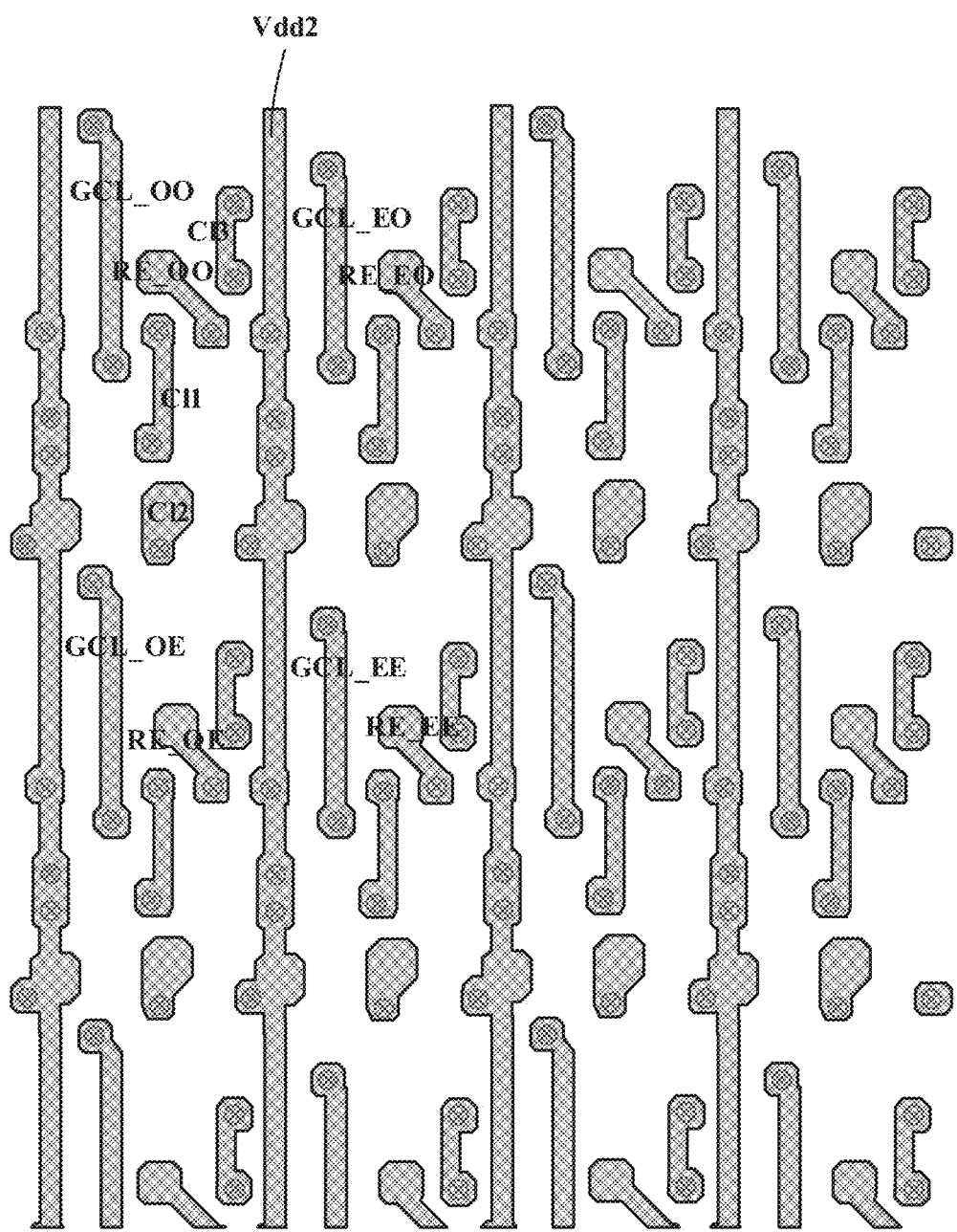
FIG. 7 is a diagram illustrating the structure of a first signal line layer in a plurality of subpixels of an array substrate depicted in FIG. 3A.
Figure 8:
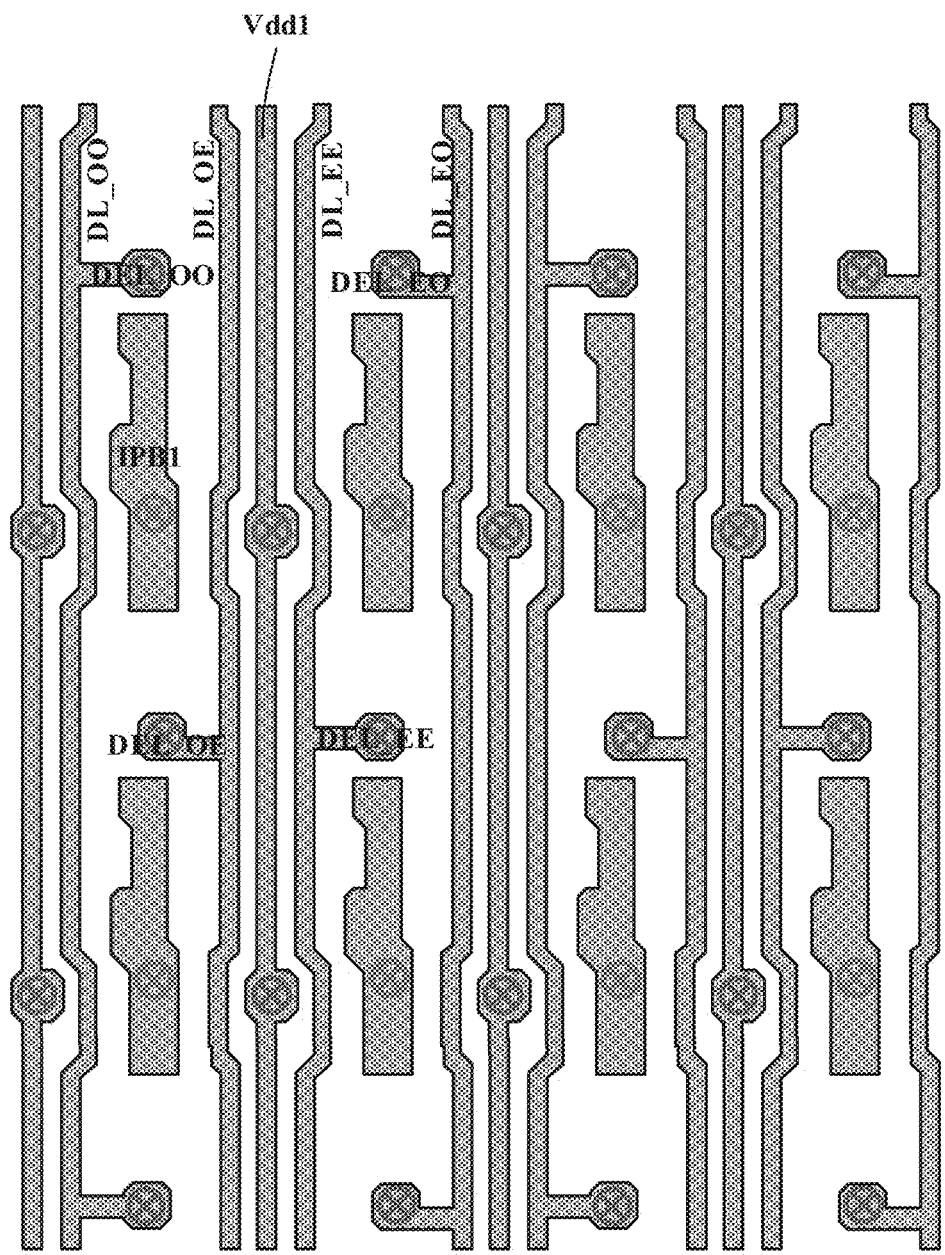
FIG. 8 is a diagram illustrating the structure of a second signal line layer in a plurality of subpixels of an array substrate depicted in FIG. 3A.
Figure 9:
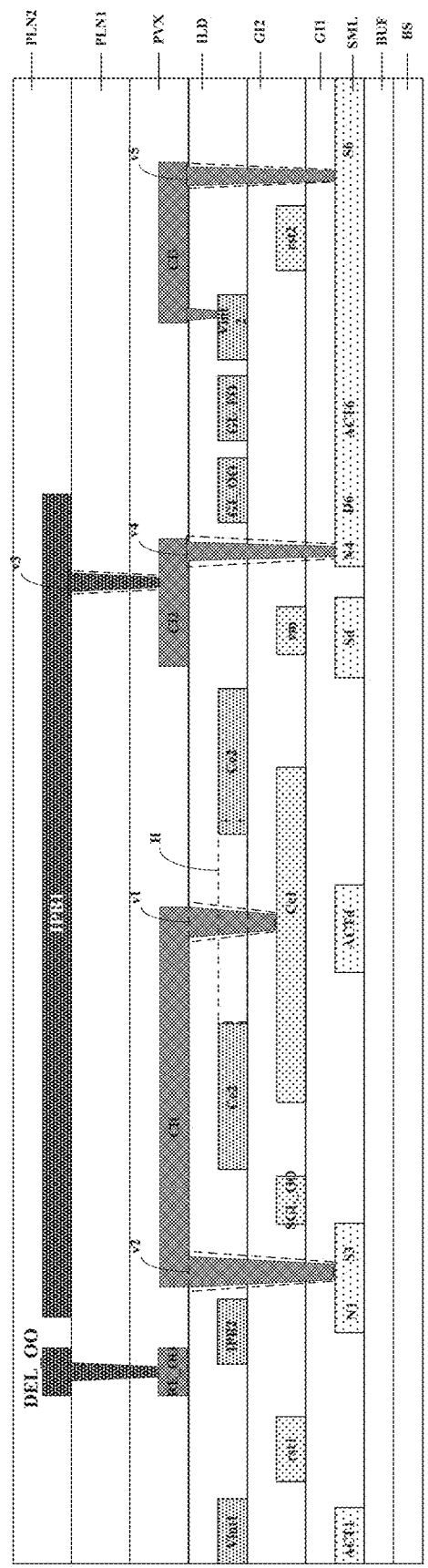
FIG. 9 is a cross-sectional view along an A-A' line in FIG. 3A.
Figure 10:
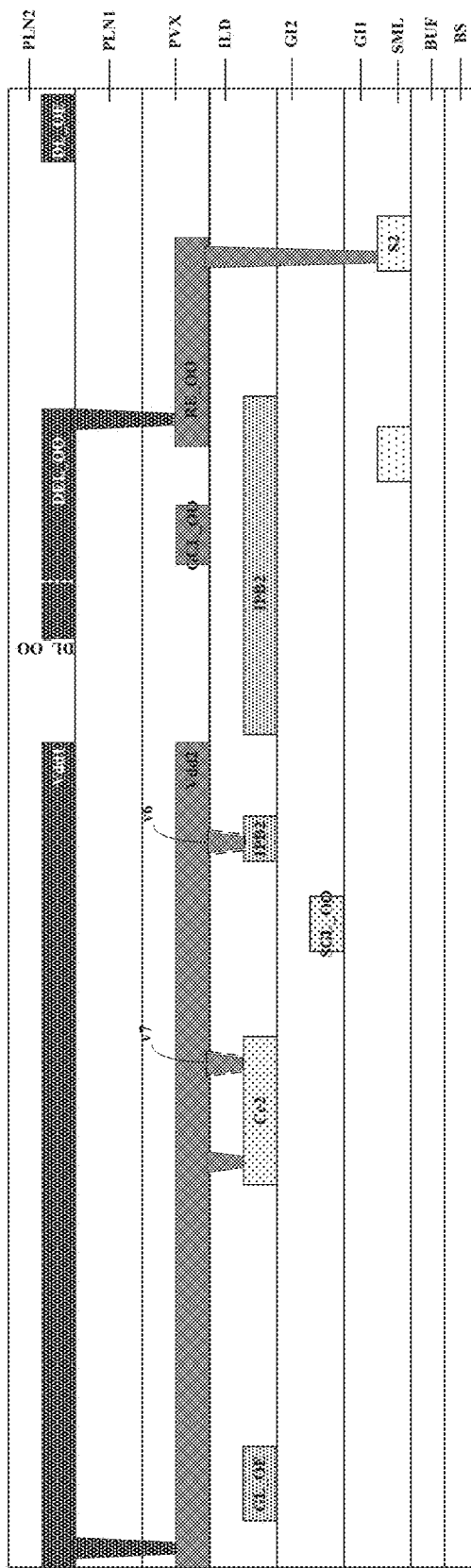
FIG. 10 is a cross-sectional view along a B-B' line in FIG. 3A.
Figure 11:
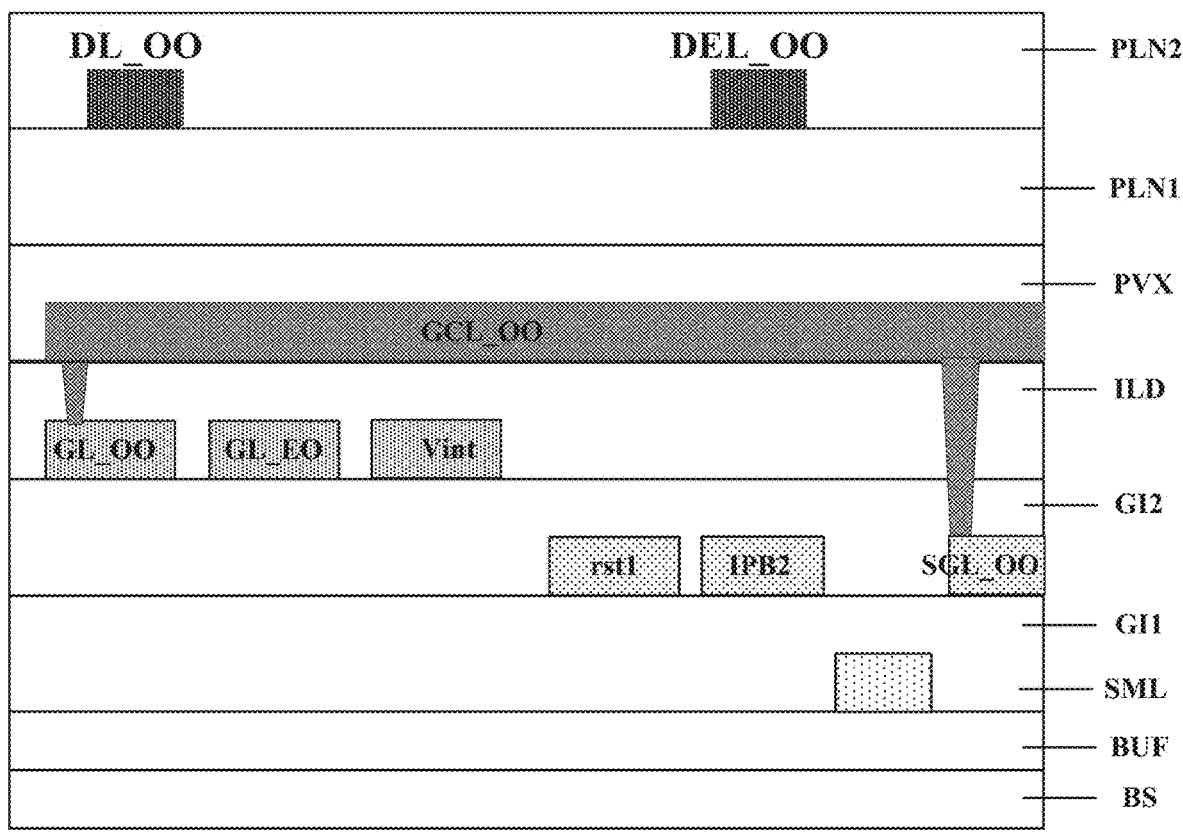
FIG. 11 is a cross-sectional view along a C-C' line in FIG. 3A.
Figure 12:
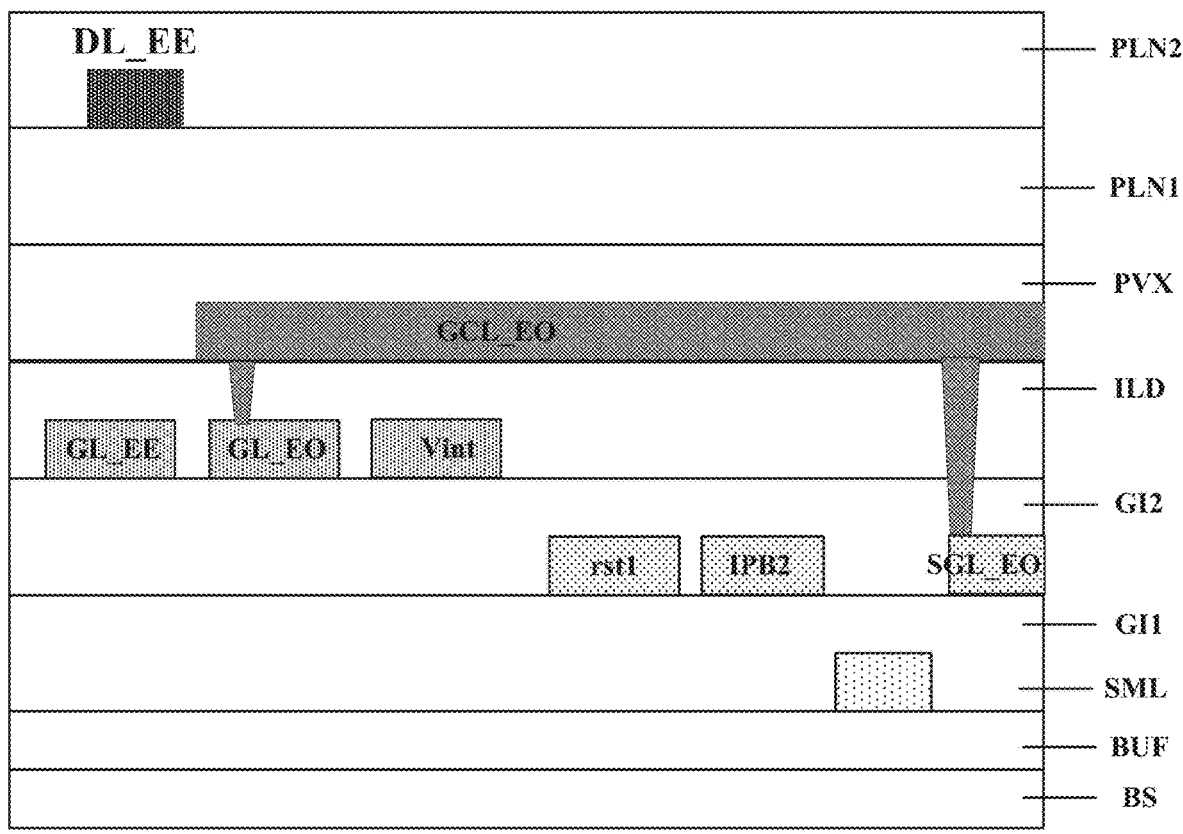
FIG. 12 is a cross-sectional view along a D-D' line in FIG. 3A.
Figure 13:
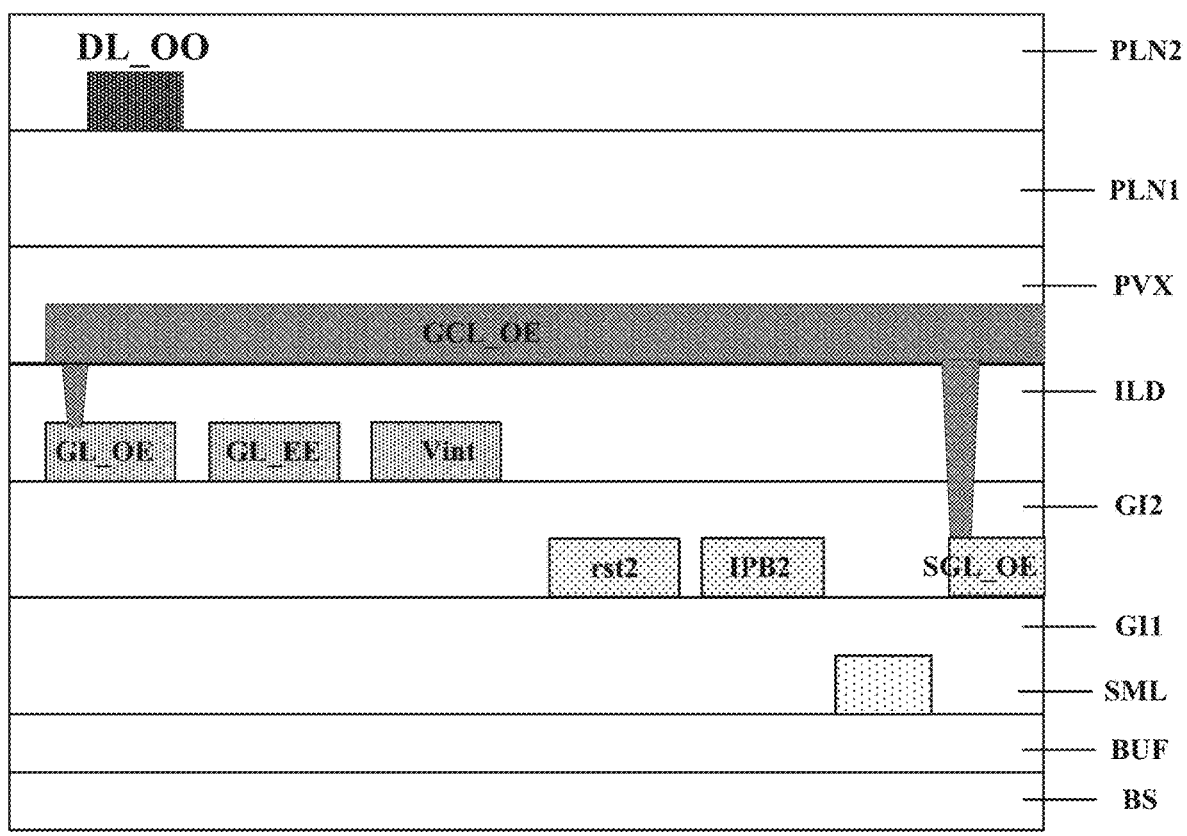
FIG. 13 is a cross-sectional view along an E-E' line in FIG. 3A.
Figure 14:
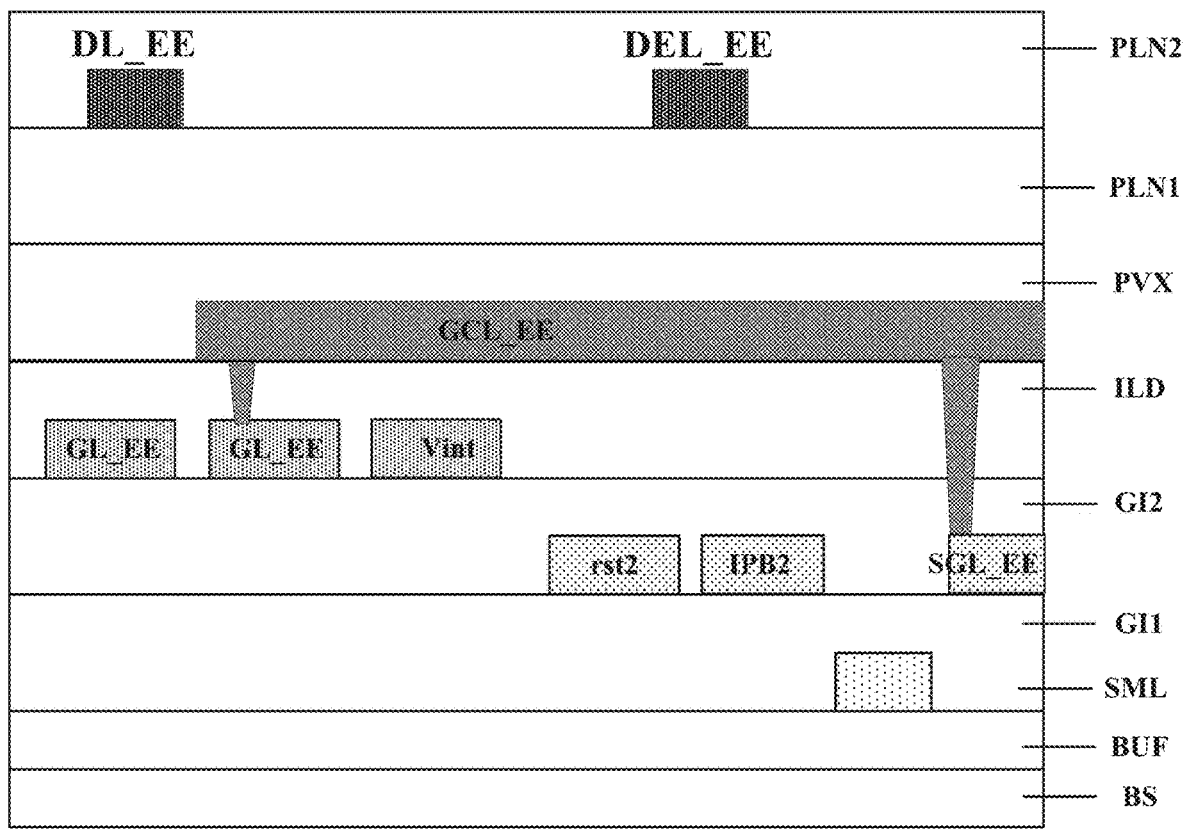
FIG. 14 is a cross-sectional view along an F-F' line in FIG. 3A.

FIG. 4 is a diagram illustrating the structure of a semiconductor material layer in a plurality of subpixels of an array substrate depicted in FIG. 3A. FIG. 5 is a diagram illustrating the structure of a first conductive layer in a plurality of subpixels of an array substrate depicted in FIG. 3A. FIG. 6 is a diagram illustrating the structure of a second conductive layer in a plurality of subpixels of an array substrate depicted in FIG. 3A. FIG. 7 is a diagram illustrating the structure of a first signal line layer in a plurality of subpixels of an array substrate depicted in FIG. 3A. FIG. 8 is a diagram illustrating the structure of a second signal line layer in a plurality of subpixels of an array substrate depicted in FIG. 3A. FIG. 9 is a cross-sectional view along an A-A' line in FIG. 3A. FIG. 10 is a cross-sectional view along a B-B' line in FIG. 3A. FIG. 1I is a cross-sectional view along a C-C' line in FIG. 3A. FIG. 12 is a cross-sectional view along a D-D' line in FIG. 3A. FIG. 13 is a cross-sectional view along an E-E' line in FIG. 3A. FIG. 14 is a cross-sectional view along an F-F' line in FIG. 3A. FIG. 9 to FIG. 11 show cross-sectional views in the respective first subpixel sp1. FIG. 12 shows a cross-sectional view in the respective fourth subpixel sp4. FIG. 13 shows a cross-sectional view in the respective second subpixel sp2. FIG. 14 shows a cross-sectional view in the respective third subpixel sp3.

Referring to FIG. 3A, FIG. 3B, and FIG. 4 to FIG. 12, in some embodiments, the array substrate includes a base substrate BS, a semiconductor material layer SML on the base substrate BS, a first gate insulating layer GI1 on a side of the semiconductor material layer SML away from the base substrate BS, a first conductive layer on a side of the first gate insulating layer GI1 away from the semiconductor material layer SML, a second gate insulating layer GI2 on a side of the first conductive layer away from the first gate insulating layer GI1, a second conductive layer on a side of the second gate insulating layer GI2 away from the first conductive layer, an inter-layer dielectric layer ILD on a side of the second conductive layer away from the second gate insulating layer GI2, a first signal line layer on a side of the inter-layer dielectric layer ILD away from the second conductive layer, optionally a passivation layer PVX on a side of the first signal line layer away from the inter-layer dielectric layer ILD; a first planarization layer PLN1 on a side of the passivation layer PVX away from the first signal line layer; a second signal line layer on a side of the first planarization layer PLN1 away from the passivation layer PVX; a second planarization layer PLN2 on a side of the second signal line layer away from the first planarization layer PLN1. Optionally, the array substrate further includes anodes on a side of the second planarization layer PLN2 away from the first planarization layer PLN1.

Referring to FIG. 2, FIG. 3A, and FIG. 4, in some embodiments, in at least a respective subpixel of the plurality of subpixels sp, the semiconductor material layer has a unitary structure. In FIG. 4, the respective first subpixel Sp1 on the left is annotated with labels indicating regions corresponding to the plurality of transistors in the pixel driving circuit, including the first transistor T1, the second transistor T2, the third transistor T3, the fourth transistor T4, the fifth transistor T5, the sixth transistor T6, and the driving transistor Td. In FIG. 4, the fourth subpixel Sp4 on the right is annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6 and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in a respective subpixel are parts of a unitary structure in the respective subpixel. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) are in a same layer.

In some embodiments, the second conductive layer includes a plurality of first gate lines; a plurality of second gate lines; a plurality of third gate lines; and a plurality of fourth gate lines. The plurality of first gate lines are configured to provide gate driving signals respectively to respective first subpixels, the plurality of second gate lines are configured to provide gate driving signals respectively to respective second subpixels, the plurality of third gate lines are configured to provide gate driving signals respectively to respective third subpixels, the plurality of fourth gate lines are configured to provide gate driving signals respectively to respective fourth subpixels.

Referring to FIG. 3B, in some embodiments, the plurality of subpixels include a respective first subpixel sp1 in the (2n−1)-th column (e.g., column OC) and in the (2m−1)-th row (e.g., row OR); a respective second subpixel sp2 in the (2n−1)-th column (e.g., column OC) and in the (2m)-th row (e.g., row ER); a respective third subpixel in the (2n)-th column (e.g., column EC) and in the (2m)-th row (e.g., row ER); and a respective fourth subpixel in the (2n)-th column (e.g., column EC) and in the (2m−1)-th row (e.g., row OR).

Referring to FIG. 2, FIG. 3A, FIG. 3B, and FIG. 6, a respective first gate line GL_OO of the plurality of first gate lines is configured to provide gate driving signals to subpixels (e.g., the respective first subpixel sp1) in a (2n−1)-th column (e.g., column OC), 1≤N/2 and in a (2m−1)-th row (e.g., row OR), 1≤m≤M/2; a respective second gate line GL_OE of the plurality of second gate lines is configured to provide gate driving signals to subpixels (e.g., the respective second subpixel sp2) in the (2n−1)-th column (e.g., column OC) and in a (2m)-th row (e.g., row ER); a respective third gate line GL_EE of the plurality of third gate lines is configured to provide gate driving signals to subpixels (e.g., the respective third subpixel sp3) in a (2n)-th column (e.g., column EC) and in the (2m)-th row (e.g., row ER); and a respective fourth gate line of the plurality of fourth gate lines is configured to provide gate driving signals to subpixels (e.g., the respective fourth subpixel sp4) in a (2n)-th column (e.g., column EC) and in the (2m−1)-th row (e.g., row OR).

In some embodiments, the second conductive layer further includes a first reset signal line Vint1 and a second reset signal line Vint2. The first reset signal line Vint1 is configured to provide a reset signal to a source electrode of the first transistor T1 in the (2m−1)-th row, and, when the (2m−1)-th row is not the first row, also provide the reset signal to a source electrode of the sixth transistor T6 in the (2m−2)-th row. The second reset signal line Vint2 is configured to provide a reset signal to a source electrode of the sixth transistor T6 in the (2m−1)-th row, and, when the (2m−1)-th row is not the last row, also provide the reset signal to a source electrode of the first transistor T1 in the (2m)-th row.

In some embodiments, the second respective gate line GL_OE and the third respective gate line GL_EE are between the respective first subpixel sp1 and the respective second subpixel sp2, and between the respective third subpixel sp3 and the respective fourth subpixel sp4. Optionally, the first respective gate line GL_OO and the fourth respective gate line GL_EO are spaced apart from the second respective gate line GL_OE and the third respective gate line GL_EE by the respective first subpixel sp1, and by the respective fourth subpixel sp4.

The present array substrate adopts a dual-gate structure in which two gate lines are between a respective reset signal line and an adjacent subpixel. For example, the respective second gate line GL_OE and the respective third gate line GL_EE are between a respective one of the plurality of reset signal lines (e.g., the second reset signal line Vint2) and the respective first subpixel sp1 or the respective fourth subpixel sp4.

Referring to FIG. 2, FIG. 3A, FIG. 3B, and FIG. 6 again, the second conductive layer in some embodiments further includes a second capacitor electrode Ce2 of the storage capacitor Cst. Optionally, the second conductive layer further includes a second interference preventing block IPB2. In some embodiments, and referring to FIG. 2, FIG. 3A, FIG. 3B, FIG. 4, FIG. 6, and FIG. 9, the second interference preventing block IPB2 and the second capacitor electrode Ce2 are in a same layer. Optionally, an orthographic projection of the second interference preventing block IPB2 on a base substrate BS is at least partially overlapping with an orthographic projection of a semiconductor material layer SML comprising a part of a respective pixel driving circuit of a plurality of pixel driving circuit on the base substrate BS. Specifically, a source electrode S3 of the third transistor T3 is electrically connected to the second capacitor electrode Ce2 through a first connecting line Cl1 (detailed discussion on the first connecting line CL1 in sections below), and electrically connected to a drain electrode of the first transistor T1. Thus, the orthographic projection of the second interference preventing block IPB2 on the base substrate BS is at least partially overlapping with an orthographic projection of the source electrode S3 of the third transistor T3 on the base substrate BS. As shown in FIG. 9, the orthographic projection of the second interference preventing block IPB2 on the base substrate BS is at least partially overlapping with an orthographic projection of the node N1 on the base substrate BS.

The inventors of the present disclosure discover that, unexpectedly and surprisingly, having the second interference preventing block IPB2 in the array substrate can effectively prevent signal interference on the node N1 of the pixel driving circuit caused by signals transmitted through the plurality of data lines (e.g., through a fringe electric field).

Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, the plurality of first gate lines (e.g., the respective first gate line GL_OO), the plurality of second gate lines (e.g., the respective second gate line GL_OE), the plurality of third gate lines (e.g., the respective third gate line GL_EE), the plurality of fourth gate lines (e.g., the respective fourth gate line GL_EO), the second capacitor electrode Ce2, the second interference preventing block IPB2, the first reset signal line Vint1, and the second reset signal line Vint2 are in a same layer.

As used herein, the term "same layer" refers to the relationship between the layers simultaneously formed in the same step. In one example, the second interference preventing block IPB2 and the second capacitor electrode Ce2 are in a same layer when they are formed as a result of one or more steps of a same patterning process performed in a same layer of material. In another example, the second interference preventing block IPB2 and the second capacitor electrode Ce2 can be formed in a same layer by simultaneously performing the step of forming the second interference preventing block IPB2, and the step of forming the second capacitor electrode Ce2. The term "same layer" does not always mean that the thickness of the layer or the height of the layer in a cross-sectional view is the same.

Referring to FIG. 2, FIG. 3A, FIG. 3B, and FIG. 5, the first conductive layer in some embodiments includes a first capacitor electrode Ce1 of the storage capacitor Cst, a first reset control signal line rst1 and a second reset signal line rst2. The first reset signal line rst1 is configured to provide a reset control signal to a source electrode of the first transistor T1 in the (2m−1)-th row, and, when the (2m−1)-th row is not the first row, also provide the reset control signal to a source electrode of the sixth transistor T6 in the (2m−2)-th row. The second reset signal line rst2 is configured to provide a reset control signal to a source electrode of the sixth transistor T6 in the (2m−1)-th row, and, when the (2m−1)-th row is not the last row, also provide the reset control signal to a source electrode of the first transistor T1 in the (2m)-th row.

In some embodiments, the first conductive layer further includes a plurality of subpixel gate lines respectively in the plurality of subpixels. Referring to FIG. 2, FIG. 3A, FIG. 3B, and FIG. 5, the plurality of subpixel gate lines in some embodiments includes a respective first subpixel gate line SGL_OO in the respective first subpixel sp1 and electrically connected to the respective first gate line GL_OO; a respective second subpixel gate line SGL_OE in the respective second subpixel sp2 and electrically connected to the respective second gate line GL_OE; a respective third subpixel gate line SGL_EE in the respective third subpixel sp3 and electrically connected to the respective third gate line GL_EE; and a respective fourth subpixel gate line SGL_EO in the respective fourth subpixel sp4 and electrically connected to the respective fourth gate line GL_EO.

In some embodiments, the respective first subpixel gate line SGL_OO, the respective second subpixel gate line SGL_OE, the respective third subpixel gate line SGL_EE, and the respective fourth subpixel gate line SGL_EO are between the first gate insulating layer GI1 and the second gate insulating layer GI2. Optionally, the respective first gate line GL_OO, the respective second gate line GL_OE, the respective third gate line GL_EE, and the respective fourth gate line GL_EO are on a side of the second gate insulating layer GI2 away from the respective first subpixel gate line SGL_OO, the respective second subpixel gate line SGL_OE, the respective third subpixel gate line SGL_EE, and the respective fourth subpixel gate line SGL_EO.

Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the first reset control signal line rst1, the light emitting control signal line em, the second reset control signal line rst2, the first capacitor electrode Ce1, and the plurality of subpixel gate lines (e.g., the first subpixel gate line SGL_OO, the respective second subpixel gate line SGL_OE, the respective third subpixel gate line SGL_EE, and the respective fourth subpixel gate line SGL_EO) are in a same layer.

Referring to FIG. 2, FIG. 3A, FIG. 3B, and FIG. 8, the second signal line layer in some embodiments includes a plurality of data lines. In some embodiments, the plurality of data lines includes a plurality of first data lines; a plurality of second data lines; a plurality of third data lines; and a plurality of fourth data lines. In some embodiments, a respective first data line DL_OO of the plurality of first data lines is configured to provide data voltage signals to subpixels (e.g., the respective first subpixel sp1) in the (2n−1)-th column (e.g., column OC) and in the (2m−1)-th row (e.g., row OR); a respective second data line DL_OE of the plurality of second data lines is configured to provide data voltage signals to subpixels (e.g., the respective second subpixel sp2) in the (2n−1)-th column (e.g., column OC) and in the (2m)-th row (e.g., row ER); a respective third data line DL_EE of the plurality of third data lines is configured to provide data voltage signals to subpixels (e.g., the respective third subpixel sp3) in the (2n)-th column and in the (2m)-th row; and a respective fourth data line DL_EO of the plurality of fourth data lines is configured to provide data voltage signals to subpixels (e.g., the respective fourth subpixel sp4) in the (2n)-th column (e.g., column EC) and in a (2m−1)-th row (e.g., row OR).

In some embodiments, the respective second data line DL_OE and the respective third data line DL_EE are between the respective first subpixel sp1 and the respective fourth subpixel sp4, and between the respective second subpixel sp2 and the respective third subpixel sp3. Optionally, the respective first data line DL_OO is spaced apart from the respective second data line DL_OE and the respective third data line DL_EE by the respective first subpixel sp1, and by the respective second subpixel sp2. Optionally, the respective fourth data line DL_EO is spaced apart from the respective second data line DL_OE and the respective third data line DL_EE by the respective third subpixel sp3, and by the respective fourth subpixel sp4.

The inventors of the present disclosure discover that having the data line arrangement in the present disclosure can effectively reduce signal interference caused by data voltage signals associated with adjacent subpixels. In particular, by preventing interference between adjacent rows of subpixels, the present data line arrangement can effectively reduce line defect along the row direction in a display panel having the array substrate.

Referring to FIG. 2, FIG. 3A, FIG. 3B, and FIG. 8, the second signal line layer in some embodiments further includes a plurality of data line extension protrusions. In some embodiments, the plurality of data line extension protrusions includes a plurality of first data line extension protrusions, a plurality of second data line extension protrusions, plurality of third data line extension protrusions, and a plurality of fourth data line extension protrusions. Optionally, a respective first data line extension protrusion DEL_OO protrudes from the respective first data line DL_OO into the respective first subpixel sp1, and electrically connecting the respective first data line DL_OO and a first pixel driving circuit in the respective first subpixel sp1. Optionally, a respective second data line extension protrusion DEL_OE protrudes from the respective second data line DL_OE into the respective second subpixel sp2, and electrically connecting the respective second data line DL_OE and a second pixel driving circuit in the respective second subpixel sp2. Optionally, a respective third data line extension protrusion DEL_EE protrudes from the respective third data line DL_EE into the respective third subpixel sp3, and electrically connecting the respective third data line DL_EE and a third pixel driving circuit in the respective third subpixel sp3. Optionally, a respective fourth data line extension protrusion DEL_EO protrudes from the respective fourth data line DL_EO into the respective fourth subpixel sp4, and electrically connecting the respective fourth data line DL_EO and a fourth pixel driving circuit in the respective fourth subpixel sp4.

In some embodiments, and referring to FIG. 2, FIG. 3A, FIG. 3B, FIG. 8, and FIG. 9, the second signal line layer further includes a first interference preventing block IPB1. The first interference preventing block IPB1 is electrically connected to an anode of a respective light emitting element LE in the respective one of the plurality of subpixels, and electrically connected to the semiconductor material layer SML. Specifically, as shown in FIG. 9, the first interference preventing block IPB1 in some embodiments is on a side of the first planarization layer PLN1 away from a first connecting line Cl1 (detailed discussion on the first connecting line CL1 in sections below). Optionally, an orthographic projection of the first interference preventing block IPB1 on a base substrate is at least partially overlapping with an orthographic projection of the first connecting line Cl1 on the base substrate BS. As shown in FIG. 2, a source electrode of the third transistor T3 is electrically connected to the second capacitor Ce2 electrode through the first connecting line Cl1, and electrically connected to a drain electrode of the first transistor T1. As shown in FIG. 9, in some embodiments, the orthographic projection of the first interference preventing block on the base substrate is at least partially overlapping with an orthographic projection of the source electrode of the third transistor on the base substrate BS.

Referring to FIG. 9, the first interference preventing block IPB1 is electrically connected to the node N4 of the pixel driving circuit. Specifically, referring to FIG. 2 and FIG. 9, the first interference preventing block IPB1 is electrically connected to a drain electrode of the fifth transistor T5 and to a drain electrode of the sixth transistor T6.

The inventors of the present disclosure discover that, unexpectedly and surprisingly, having the first interference preventing block IPB1 (having electric potential of the node N4 and at least partially overlapping the node N1) in the array substrate can further effectively prevent signal interference on the node N1 of the pixel driving circuit caused by signals transmitted through the plurality of data lines (e.g., through a fringe electric field) on two sides of the node N1.

In some embodiments, and referring to FIG. 2, FIG. 3A, FIG. 3B, FIG. 8, and FIG. 9, the second signal line layer further includes a plurality of first voltage supply lines Vdd1, configured to provide a power supply signal to the plurality of subpixels.

Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally the plurality of data lines (e.g., the respective first data line DL_OO, the respective second data line DL_OE, the respective third data line DL_EE and the respective fourth data line DL_EO), the first interference preventing block IPB1, the plurality of data line extension protrusions (e.g., the respective first data line extension protrusion DEL_OO, the respective second data line extension protrusion DEL_OE, the respective third data line extension protrusion DEL_EE, and the respective fourth data line extension protrusion DEL_EO), and the plurality of first voltage supply lines Vdd1 are in a same layer.

Referring to FIG. 2, FIG. 3A, FIG. 3B, and FIG. 7, the first signal line layer in some embodiments includes a plurality of second voltage supply lines Vdd2 configured to provide a power voltage signal to the plurality of subpixels. Referring to FIG. 2, FIG. 3A, FIG. 3B, FIG. 7, and FIG. 8, in some embodiments, the plurality of first voltage supply lines Vdd1 and the plurality of second voltage supply lines Vdd2 are substantially parallel to each other. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees. Referring to FIG. 10, in some embodiments, an orthographic projection of a respective one of the plurality of first voltage supply lines Vdd1 on the base substrate BS is at least partially overlapping with an orthographic projection of a respective one of the plurality of second voltage supply lines Vdd2 on the base substrate BS. Optionally, the orthographic projection of a respective one of the plurality of first voltage supply lines Vdd1 on the base substrate BS substantially overlaps with the orthographic projection of a respective one of the plurality of second voltage supply lines Vdd2 on the base substrate BS. As used herein, the term "substantially overlap" refers to two orthographic projections at least 50 percent, e.g., at least 60 percent, at least 70 percent, at least 80 percent, at least 90 percent, at least 95 percent, at least 99 percent, or 100 percent overlapping with each other.

Optionally, the plurality of data lines, the plurality of first voltage supply lines Vdd1, and the plurality of second voltage supply lines Vdd2 are substantially parallel to each other. Optionally, the plurality of data line extension protrusions (e.g., the respective first data line extension protrusion DEL_OO, the respective second data line extension protrusion DEL_OE, the respective third data line extension protrusion DEL_EE, and the respective fourth data line extension protrusion DEL_EO) are substantially perpendicular to the plurality of data lines (e.g., the respective first data line DL_OO, the respective second data line DL_OE, the respective third data line DL_EE and the respective fourth data line DL_EO). As used herein, the term "substantially perpendicular" means that an angle is in the range of approximately 45 degrees to approximately 135 degrees, e.g., approximately 85 degrees to approximately 95 degrees, approximately 80 degrees to approximately 100 degrees, approximately 75 degrees to approximately 105 degrees, approximately 70 degrees to approximately 110 degrees, approximately 65 degrees to approximately 115 degrees, approximately 60 degrees to approximately 120 degrees.

Referring to FIG. 10 again, in some embodiments, the respective one of the plurality of first voltage supply lines Vdd1 is connected to the respective one of the plurality of second voltage supply lines Vdd2 through a via extending through the first planarization layer PLN1. Optionally, the array substrate further includes a passivation layer PVX between the first planarization layer PLN1 and the interlayer dielectric layer ILD, and the respective one of the plurality of first voltage supply lines Vdd1 is connected to the respective one of the plurality of second voltage supply lines Vdd2 through a via extending through the first planarization layer PLN1 as well as the passivation layer PVX.

The inventors of the present disclosure discover that having a double-layer voltage supply lines arrangement can effectively reduce signal interference caused by data voltage signals associated with adjacent subpixels. In particular, the double-layer voltage supply lines is disposed between two adjacent data lines (e.g., between the respective second data line DL_OE and the respective third data line DL_EE). The inventors of the present disclosure discover that, unexpectedly and surprisingly, the double-layer voltage supply lines arrangement can effectively prevent interference between adjacent columns of subpixels. The present array substrate can effectively reduce line defect along the column direction in a display panel having the array substrate.

In some embodiments, the first signal line layer in some embodiments further includes a plurality of gate line connecting lines. In some embodiments, the plurality of gate line connecting lines includes a plurality of first gate line connecting lines, a plurality of second gate line connecting lines, a plurality of third gate line connecting lines, and a plurality of fourth gate line connecting lines. Referring to FIG. 2, FIG. 3A, FIG. 3B, FIG. 7, and FIG. 11 to FIG. 14, a respective first gate line connecting line GCL_OO extends into the respective first subpixel sp1, electrically connecting the respective first gate line GL_OO and the respective first subpixel gate line SGL_OO; a respective second gate line connecting line GCL_OE extends into the respective second subpixel sp2, electrically connecting the respective second gate line GL_OE and the respective second subpixel gate line SGL_OE; a respective third gate line connecting line GCL_EE extends into the respective third subpixel sp3, electrically connecting the respective third gate line GL_EE and the respective third subpixel gate line SGL_EE; and a respective fourth gate line connecting line GCL_EO extends into the respective fourth subpixel sp4, electrically connecting the respective fourth gate line GL_EO and the respective fourth subpixel gate line SGL_EO.

Referring to FIG. 7, FIG. 11 to FIG. 14, in some embodiments, the respective first subpixel gate line SGL_OO, the respective second subpixel gate line SGL_OE, the respective third subpixel gate line SGL_EE, and the respective fourth subpixel gate line SGL_EO are between the first gate insulating layer GI1 and the second gate insulating layer GI2. Optionally, the respective first gate line GL_OO, the respective second gate line GL_OE, the respective third gate line GL_EE, and the respective fourth gate line GL_EO are on a side of the second gate insulating layer GI2 away from the respective first subpixel gate line SGL_OO, the respective second subpixel gate line SGL_OE, the respective third subpixel gate line SGL_EE, and the respective fourth subpixel gate line SGL_EO. Optionally, the respective first gate line connecting line GCL_OO, the respective second gate line connecting line GCL_OE, the respective third gate line connecting line GCL_EE, and the respective fourth gate line connecting line GCL_EO are on a side of the inter-layer dielectric layer ILD away from the respective first gate line GL_OO, the respective second gate line GL_OE, the respective third gate line GL_EE, and the respective fourth gate line GL_EO.

In some embodiments, and referring to FIG. 2, FIG. 3A, FIG. 3B, and FIG. 7, the first signal line layer in some embodiments further includes a first connecting line Cl1. Referring to FIG. 2, FIG. 3A, FIG. 3B, FIG. 7, and FIG. 9, in some embodiments, the first connecting line Cl1 is electrically connected to the first capacitor electrode Ce1 through a hole in the second capacitor electrode Ce2, and electrically connected to a semiconductor material layer SML comprising a part of a respective pixel driving circuit of a plurality of pixel driving circuit. Optionally, an orthographic projection of the second capacitor electrode Ce2 on the base substrate BS completely covers, with a margin, an orthographic projection of the first capacitor electrode Ce1 on the base substrate BS except for a hole region H in which a portion of the second capacitor electrode Ce2 is absent. Optionally, the first capacitor electrode Ce1 is between the first gate insulating layer GI1 and the second gate insulating layer GI2; the second capacitor electrode Ce2 is between the second gate insulating layer GI2 and the inter-layer dielectric layer ILD; and the first connecting line Cl1 is on a side of the inter-layer dielectric layer ILD away from the second capacitor electrode Ce2. Referring to FIG. 9, the array substrate in some embodiments further includes a first via v1 in the hole region H and extending through the inter-layer dielectric layer ILD and the second gate insulating layer GI2; and a second via v2 extending through the inter-layer dielectric layer ILD, the second gate insulating layer GI2, and the first gate insulating layer GI1. Optionally, the first connecting line Cl1 is connected to the first capacitor electrode Ce1 through the first via v1; and the first connecting line Cl1 is connected to a semiconductor material layer SML through the second via v2.

Referring to FIG. 2 and FIG. 4, in some embodiments, a source electrode S3 of the third transistor T3, an active layer ACT3 of the third transistor T3, a drain electrode D3 of the third transistor T3, a source electrode S1 of the first transistor T1, an active layer ACT1 of the first transistor T1, a drain electrode D1 of the first transistor T1 are parts of a unitary structure in the respective one of the plurality of subpixels. Referring to FIG. 9 and FIG. 4, the first connecting line Cl1 in some embodiments is connected to the source electrode S2 of the third transistor T2 and the drain electrode D1 of the first transistor T1 through the second via v2.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

In some embodiments, and referring to FIG. 2, FIG. 3A, FIG. 3B, and FIG. 7, the first signal line layer further includes a second connecting line Cl2. Referring to FIG. 10, the second connecting line Cl2 electrically connects the first interference preventing block IPB1 and the semiconductor material layer SML. Optionally, the first connecting line Cl1 and the second connecting line Cl2 are in a same layer. Optionally, the first interference preventing block IPB1 is electrically connected to the second connecting line Cl2 through a third via v3 extending through the first planarization layer PLN1. Optionally, the second connecting line Cl2 is electrically connected to the semiconductor material layer SML through a fourth via v4 extending through the inter-layer dielectric layer ILD, the second gate insulating layer GI2, and the first gate insulating layer GI1.

Referring to FIG. 2 and FIG. 4, in some embodiments, a source electrode S5 of the fifth transistor T5, an active layer ACT5 of the fifth transistor T5, a drain electrode D5 of the fifth transistor T5, a source electrode S6 of the sixth transistor T6, an active layer ACT6 of the sixth transistor T6, a drain electrode D6 of the sixth transistor T6 are parts of a unitary structure in the respective one of the plurality of subpixels. Referring to FIG. 9 and FIG. 4, the second connecting line Cl2 is electrically connected to the drain electrode D5 of the fifth transistor T5 and the drain electrode D6 of the sixth transistor T6 through the fourth via v4.

In some embodiments, and referring to FIG. 2, FIG. 3A, FIG. 3B, and FIG. 7, the first signal line layer further includes a third connecting line Cl3. Referring to FIG. 9, in some embodiment, the third connecting line Cl3 electrically connects a reset signal line (e.g., a second reset signal line Vint2) to the semiconductor material layer SML. Optionally, the third connecting line is Cl3 electrically connected to the semiconductor material layer SML though a fifth via v5 extending through the inter-layer dielectric layer ILD, the second gate insulating layer GI2, and the first gate insulating layer GI1. Referring to FIG. 2, FIG. 4, and FIG. 9, the third connecting line is electrically connected to a source electrode S6 of the sixth transistor T6.

In some embodiments, and referring to FIG. 2, FIG. 3A, FIG. 3B, and FIG. 7, the first signal line layer further includes a plurality of relay electrodes. In some embodiments, the plurality of relay electrodes includes a plurality of first relay electrodes, a plurality of second relay electrodes, a plurality of third relay electrodes, and a plurality of fourth relay electrodes. Optionally, a respective first relay electrode RE_OO is in the respective first subpixel sp1; a respective second relay electrode RE_OE is in the respective second subpixel sp2; a respective third relay electrode RE_EE is in the respective third subpixel sp3; and a respective fourth relay electrode RE_EO is in the respective fourth subpixel sp4. Optionally, the first planarization layer PLN1 between is the plurality of data lines (e.g., the respective first data line DL_OO, the respective second data line DL_OE, the respective third data line DL_EE and the respective fourth data line DL_EO) and the respective first relay electrode RE_OO, the respective second relay electrode RE_OE, the respective third relay electrode RE_EE, and the respective fourth relay electrode RE_EO.

Figure 15:
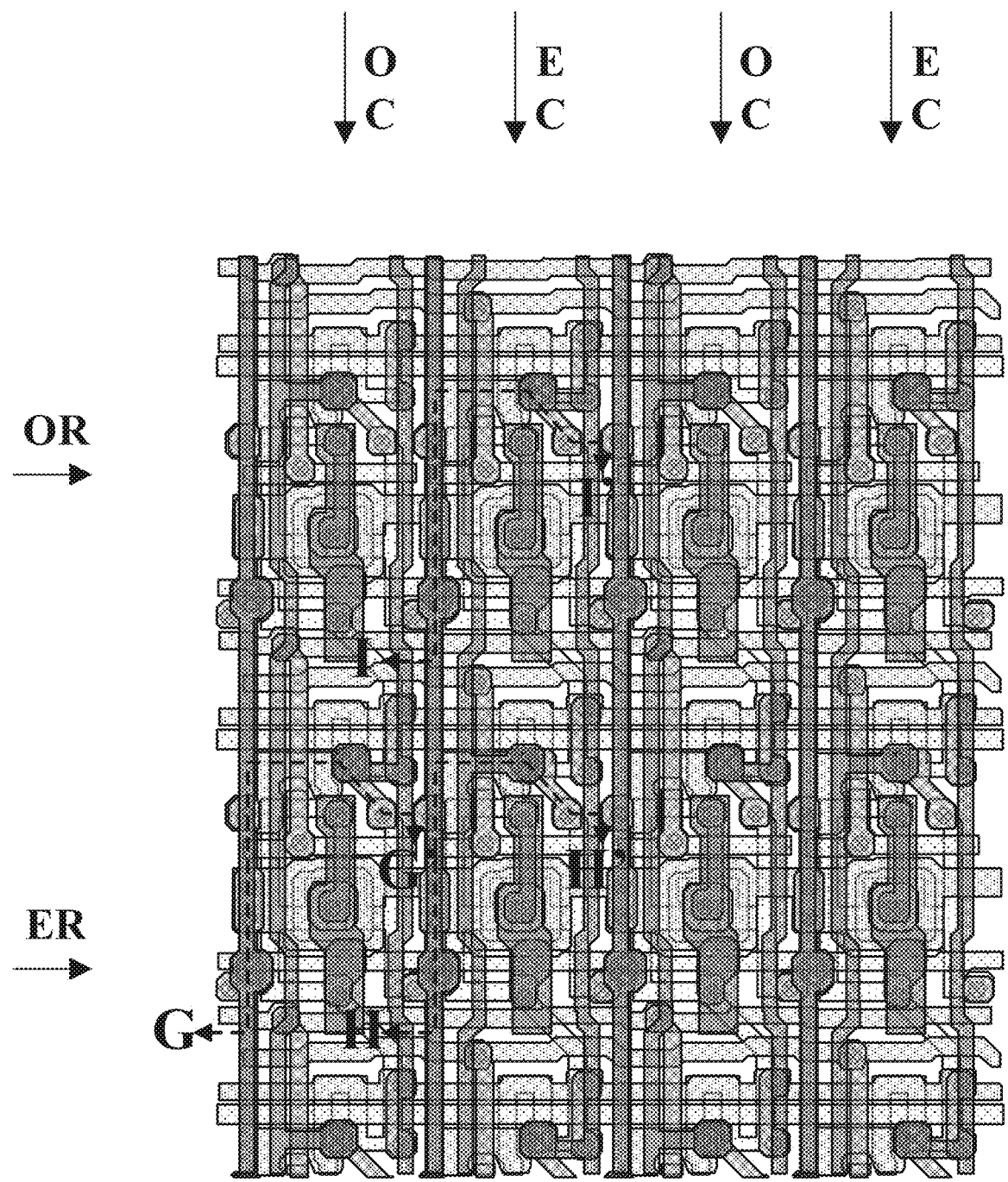
FIG. 15 is a diagram illustrating the structure of a plurality of subpixels of an array substrate in some embodiments according to the present disclosure.
Figure 16:
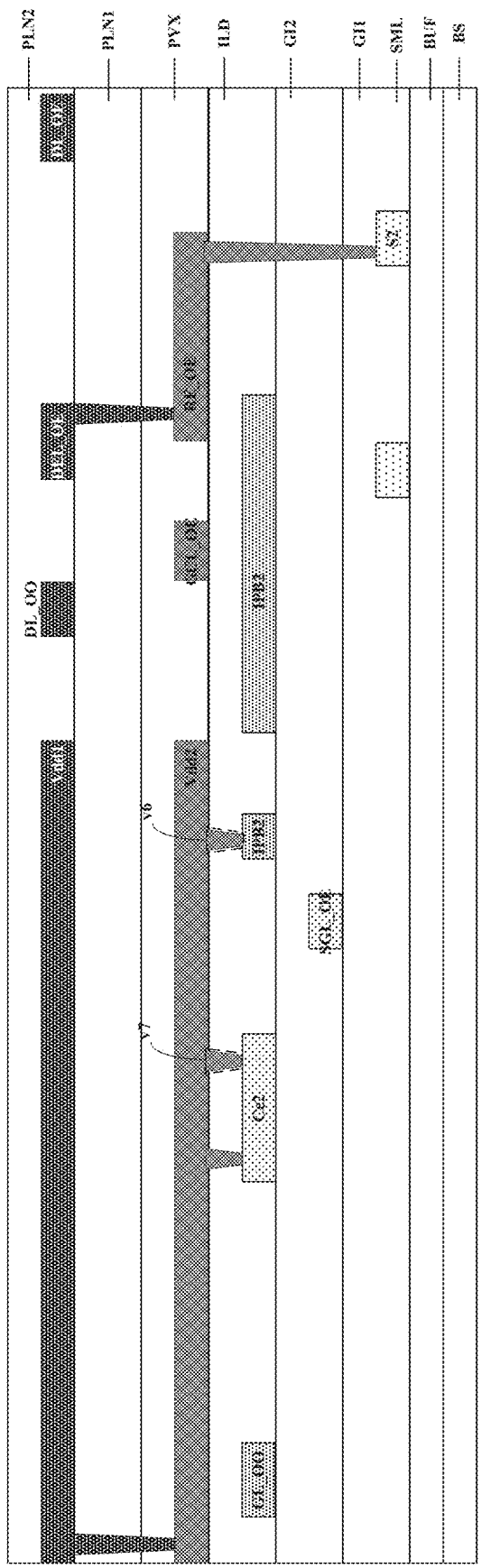
FIG. 16 is a cross-sectional view along a G-G' line in FIG. 15.
Figure 17:
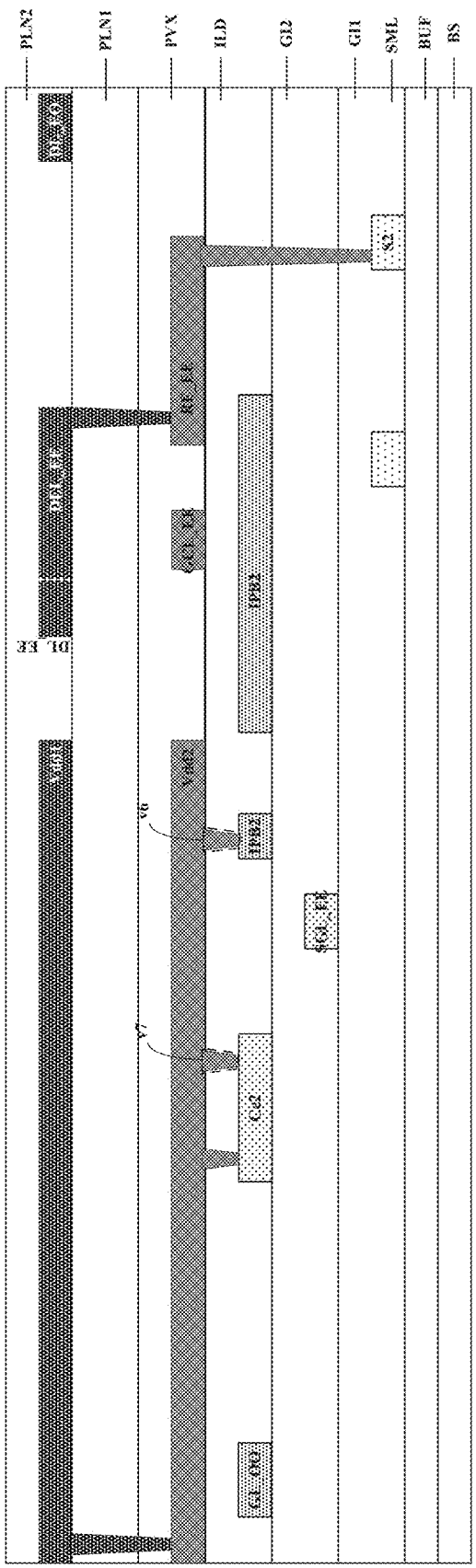
FIG. 17 is a cross-sectional view along an H-H' line in FIG. 15.
Figure 18:
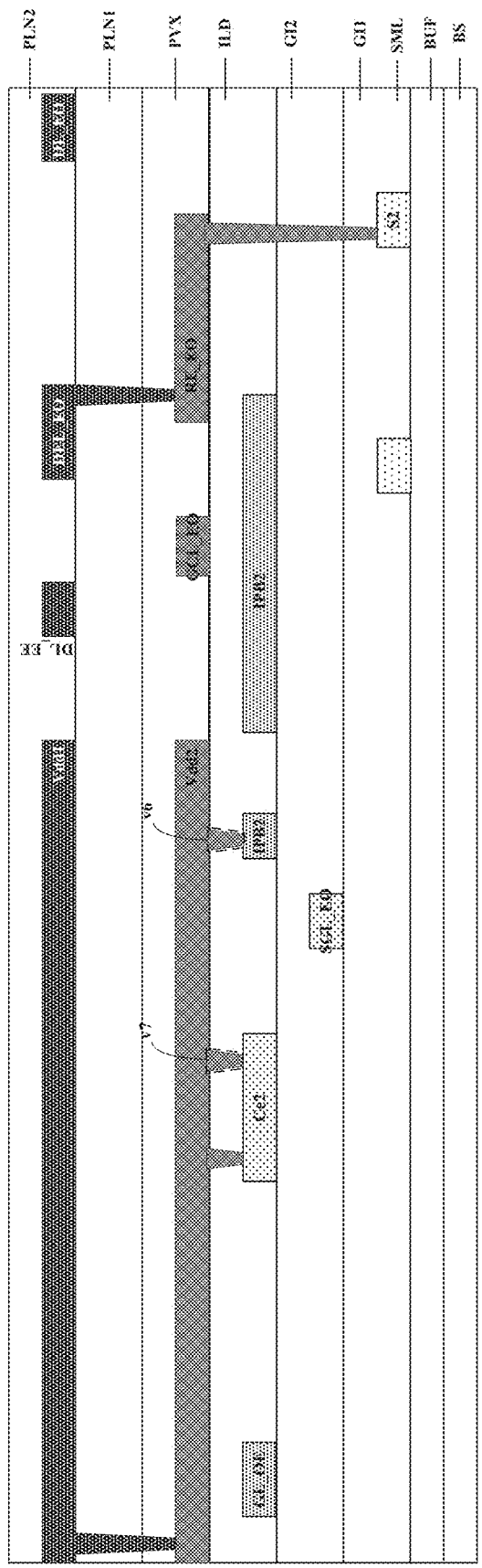
FIG. 18 is a cross-sectional view along an I-I' line in FIG. 15.

In some embodiments, the respective first relay electrode RE_OO, the respective second relay electrode RE_OE, the respective third relay electrode RE_EE, and the respective fourth relay electrode RE_EO are respectively connected to the respective first data line extension protrusion DEL_OO, the respective second data line extension protrusion DEL_OE, the respective third data line extension protrusion DEL_EE, and the respective fourth data line extension protrusion DEL_EO respectively through vias respectively extending through the first planarization layer PLN1. FIG. 9 and FIG. 10 illustrate the connection between the respective first relay electrode RE_OO and the respective first data line extension protrusion DEL_GO. FIG. 15 is a diagram illustrating the structure of a plurality of subpixels of an array substrate in some embodiments according to the present disclosure. FIG. 16 is a cross-sectional view along a G-G' line in FIG. 15. FIG. 17 is a cross-sectional view along an H-H' line in FIG. 15. FIG. 18 is a cross-sectional view along an I-I' line in FIG. 15. FIG. 16 illustrates the connection between the respective first relay electrode RE_OE and the respective first data line extension protrusion DEL_OE. FIG. 17 illustrates the connection between the respective first relay electrode RE_EE and the respective first data line extension protrusion DEL_EE. FIG. 18 illustrates the connection between the respective first relay electrode RE_EO and the respective first data line extension protrusion DEL_EO.

Referring to FIG. 7, FIG. 8, FIG. 10, and FIG. 16 to FIG. 18, in some embodiments, the respective first relay electrode RE_OO electrically connects the respective first data line extension protrusion DEL_OO to the semiconductor material layer SML; the respective second relay electrode RE_OE electrically connects the respective second data line extension protrusion DEL_OE to the semiconductor material layer; the respective third relay electrode RE_EE electrically connects the respective third data line extension protrusion DEL_EE to the semiconductor material layer; and the respective fourth relay electrode RE_EO electrically connects the respective fourth data line extension protrusion DEL_EO to the semiconductor material layer. Optionally, the inter-layer dielectric layer ILD, the second gate insulating layer GI2, and the first gate insulating layer GI1 are between the semiconductor material layer SML and the respective first relay electrode RE_OO, the respective second relay electrode RE_OE, the respective third relay electrode RE_EE, the respective fourth relay electrode RE_EO. Optionally, the respective first relay electrode RE_OO, the respective second relay electrode RE_OE, the respective third relay electrode RE_EE, and the respective fourth relay electrode RE_EO are respectively connected to source electrodes of second transistors respectively in the first pixel driving circuit, the second pixel driving circuit, the third pixel driving circuit, and the fourth pixel driving circuit, respectively through vias respectively extending through the inter-layer dielectric layer ILD, the second gate insulating layer GI2, and the first gate insulating layer GI1.

Referring to FIG. 10, and FIG. 16 to FIG. 18, in some embodiments, a respective one of the plurality of second voltage supply lines Vdd2 is electrically connected to the second interference preventing block IPB2 through a sixth via v6 extending through the inter-layer dielectric layer ILD. Optionally, the respective one of the plurality of second voltage supply lines Vdd2 is electrically connected to the second capacitor electrode Ce2 through a seventh via v7 extending through the inter-layer dielectric layer ILD.

Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of second voltage supply line Vdd2, the first connecting line Cl1, the second connecting line Cl2, the third connecting line Cl3, the plurality of gate line connecting lines (e.g., the respective first gate line connecting line GCL_OO, the respective second gate line connecting line GCL_OE, the respective third gate line connecting line GCL_EE, and the respective fourth gate line connecting line GCL_EO), and the plurality of relay electrodes (e.g., the respective first relay electrode RE_OO, the respective second relay electrode RE_OE, the respective third relay electrode RE_EE, and the respective fourth relay electrode RE_EO) are in a same layer.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

In another aspect, the present invention provides a display apparatus, comprising the array substrate described herein or fabricated by a method described herein, and one or more integrated circuits connected to the array substrate In another aspect, the present invention provides a method of fabricating an array substrate. In some embodiments, the method includes forming a plurality of subpixels arranged in an array comprising M rows and N columns. The method in some embodiments includes forming a plurality of first gate lines; forming a plurality of second gate lines; forming a plurality of third gate lines; forming a plurality of fourth gate lines; forming a plurality of first data lines; forming a plurality of second data lines; forming a plurality of third data lines; and forming a plurality of fourth data lines. Optionally, a respective first gate line of the plurality of first gate lines is configured to provide gate driving signals to subpixels in a (2n−1)-th column, $1 \leq n \leq N/2$ and in a (2m−1)-th row, $1 \leq m \leq M/2$. Optionally, a respective second gate line of the plurality of second gate lines is configured to provide gate driving signals to subpixels in the (2n−1)-th column and in a (2m)-th row. Optionally, a respective third gate line of the plurality of third gate lines is configured to provide gate driving signals to subpixels in a (2n)-th column and in the (2m)-th row. Optionally, a respective fourth gate line of the plurality of fourth gate lines is configured to provide gate driving signals to subpixels in a (2n)-th column and in the (2m−1)-th row. Optionally, a respective first data line of the plurality of first data lines is configured to provide data voltage signals to subpixels in the (2n−1)-th column and in the (2m−1)-th row. Optionally, a respective second data line of the plurality of second data lines is configured to provide data voltage signals to subpixels in the (2n−1)-th column and in the (2m)-th row. Optionally, a respective third data line of the plurality of third data lines is configured to provide data voltage signals to subpixels in the (2n)-th column and in the (2m)-th row. Optionally, a respective fourth data line of the plurality of fourth data lines is configured to provide data voltage signals to subpixels in the (2n)-th column and in a (2m−1)-th row. Optionally, forming the plurality of subpixels includes forming a respective first subpixel in the (2n−1)-th column and in the (2m−1)-th row; forming a respective second subpixel in the (2n−1)-th column and in the (2m)-th row; forming a respective third subpixel in the (2n)-th column and in the (2m)-th row; and forming a respective fourth subpixel in the (2n)-th column and in the (2m−1)-th row. M and N are even integer numbers greater than 2, e.g., greater than 50, greater than 100, greater than 200, or greater than 500.

In some embodiments, the second respective gate line and the third respective gate line are formed between the respective first subpixel and the respective second subpixel, and between the respective third subpixel and the respective fourth subpixel. Optionally, the first respective gate line and the fourth respective gate line are formed to be spaced apart from the second respective gate line and the third respective gate line by the respective first subpixel, and by the respective fourth subpixel. Optionally, the respective second data line and the respective third data line are formed between the respective first subpixel and the respective fourth subpixel, and between the respective second subpixel and the respective third subpixel. Optionally, the respective first data line is formed to be spaced apart from the respective second data line and the respective third data line by the respective first subpixel, and by the respective second subpixel. Optionally, the respective fourth data line is formed to be spaced apart from the respective second data line and the respective third data line by the respective third subpixel, and by the respective fourth subpixel.

In some embodiments, the method includes forming a plurality of subpixel gate lines. Optionally, forming the plurality of subpixel gate lines includes forming a respective first subpixel gate line in the respective first subpixel and electrically connected to the respective first gate line; forming a respective second subpixel gate line in the respective second subpixel and electrically connected to the respective second gate line; forming a respective third subpixel gate line in the respective third subpixel and electrically connected to the respective third gate line; and forming a respective fourth subpixel gate line in the respective fourth subpixel and electrically connected to the respective fourth gate line.

In some embodiments, the method further includes forming a first gate insulating layer and forming a second gate insulating layer. Optionally, the respective first subpixel gate line, the respective second subpixel gate line, the respective third subpixel gate line, and the respective fourth subpixel gate line are formed between the first gate insulating layer and the second gate insulating layer. Optionally, the respective first gate line, the respective second gate line, the respective third gate line, and the respective fourth gate line are formed on a side of the second gate insulating layer away from the respective first subpixel gate line, the respective second subpixel gate line, the respective third subpixel gate line, and the respective fourth subpixel gate line.

In some embodiments, forming a respective pixel driving circuit of a plurality of pixel driving circuit of the array substrate includes forming a storage capacitor. Optionally, forming the storage capacitor includes forming a first capacitor electrode in a same layer as the respective first subpixel gate line, the respective second subpixel gate line, the respective third subpixel gate line, and the respective fourth subpixel gate line; and forming a second capacitor electrode in a same layer as the respective first gate line, the respective second gate line, the respective third gate line, and the respective fourth gate line.

In some embodiments, the method further includes forming a plurality of gate line connecting lines. Optionally, forming the plurality of gate line connecting lines includes forming a respective first gate line connecting line extending into the respective first subpixel; forming a respective second gate line connecting line extending into the respective second subpixel; forming a respective third gate line connecting line extending into the respective third subpixel; and forming a respective fourth gate line connecting line extending into the respective fourth subpixel. Optionally, the respective first gate line connecting line is formed to electrically connect the respective first gate line and the respective first subpixel gate line; the respective second gate line connecting line is formed to electrically connect the respective second gate line and the respective second subpixel gate line; the respective third gate line connecting line is formed to electrically connect the respective third gate line and the respective third subpixel gate line; and the respective fourth gate line connecting line is formed to electrically connect the respective fourth gate line and the respective fourth subpixel gate line.

In some embodiments, the method further includes forming a first gate insulating layer, forming a second gate insulating layer, and forming an inter-layer dielectric layer. Optionally, the respective first subpixel gate line, the respective second subpixel gate line, the respective third subpixel gate line, and the respective fourth subpixel gate line are formed between the first gate insulating layer and the second gate insulating layer. Optionally, the respective first gate line, the respective second gate line, the respective third gate line, and the respective fourth gate line are formed on a side of the second gate insulating layer away from the respective first subpixel gate line, the respective second subpixel gate line, the respective third subpixel gate line, and the respective fourth subpixel gate line. Optionally, the respective first gate line connecting line, the respective second gate line connecting line, the respective third gate line connecting line, and the respective fourth gate line connecting line are formed on a side of the inter-layer dielectric layer away from the respective first gate line, the respective second gate line, the respective third gate line, and the respective fourth gate line.

In some embodiments, forming a respective one of the plurality of subpixels further includes forming a first connecting line electrically connected to the first capacitor electrode through a hole in the second capacitor electrode, and electrically connected to a semiconductor material layer comprising a part of a respective pixel driving circuit of a plurality of pixel driving circuit.

In some embodiments, forming a respective pixel driving circuit of a plurality of pixel driving circuit of the array substrate includes forming a storage capacitor comprising a first capacitor electrode and a second capacitor electrode. An orthographic projection of the second capacitor electrode on a base substrate completely covers, with a margin, an orthographic projection of the first capacitor electrode on the base substrate except for a hole region in which a portion of the second capacitor electrode is absent. Optionally, the method further includes forming a first gate insulating layer, forming a second gate insulating layer, and forming an inter-layer dielectric layer. Optionally, the first capacitor electrode is formed between the first gate insulating layer and the second gate insulating layer. Optionally, the second capacitor electrode is formed between the second gate insulating layer and the inter-layer dielectric layer. Optionally, the first connecting line is formed on a side of the inter-layer dielectric layer away from the second capacitor electrode. Optionally, the method further includes forming a first via in the hole region and extending through the inter-layer dielectric layer and the second gate insulating layer; and forming a second via extending through the inter-layer dielectric layer, the second gate insulating layer, and the first gate insulating layer. Optionally, the first connecting line is formed to be connected to the first capacitor electrode through the first via; and the first connecting line is formed to be connected to a semiconductor material layer through the second via.

In some embodiments, forming the respective pixel driving circuit of a plurality of pixel driving circuit includes forming a driving transistor; forming a first transistor; forming a second transistor; forming a third transistor; forming a fourth transistor; forming a fifth transistor; and forming a sixth transistor. Optionally, a source electrode of the third transistor, an active layer of the third transistor, a drain electrode of the third transistor, a source electrode of the first transistor, an active layer of the first transistor, a drain electrode of the first transistor are formed as parts of a unitary structure in the respective one of the plurality of subpixels. Optionally, the first connecting line is formed to be connected to the source electrode of the third transistor and the drain electrode of the first transistor through the second via.

In some embodiments, forming the respective one of the plurality of subpixels further includes forming a first planarization layer on the first connecting line, and forming a first interference preventing block on a side of the first planarization layer away from the first connecting line. An orthographic projection of the first interference preventing block on a base substrate is at least partially overlapping with an orthographic projection of the first connecting line on the base substrate. Optionally, the first interference preventing block is formed to be electrically connected to an anode of a respective light emitting element in the respective one of the plurality of subpixels, and electrically connected to the semiconductor material layer.

In some embodiments, forming the respective pixel driving circuit of a plurality of pixel driving circuit includes forming a driving transistor; forming a first transistor; forming a second transistor; forming a third transistor; forming a fourth transistor; forming a fifth transistor; and forming a sixth transistor. Optionally, a source electrode of the third transistor is formed to be electrically connected to the second capacitor electrode through a first connecting line, and electrically connected to a drain electrode of the first transistor. Optionally, the orthographic projection of the first interference preventing block on the base substrate is at least partially overlapping with an orthographic projection of the source electrode of the third transistor on the base substrate.

In some embodiments, forming the respective one of the plurality of subpixels further includes forming a second connecting line electrically connecting the first interference preventing block and the semiconductor material layer. Optionally, the first connecting line and the second connecting line are formed in a same layer. Optionally, the first interference preventing block is formed to be electrically connected to the second connecting line through a third via extending through the first planarization layer. Optionally, the second connecting line is formed to be electrically connected to the semiconductor material layer through a fourth via extending through the inter-layer dielectric layer, the second gate insulating layer, and the first gate insulating layer.

In some embodiments, forming the respective pixel driving circuit of a plurality of pixel driving circuit includes forming a driving transistor; forming a first transistor; forming a second transistor; forming a third transistor; forming a fourth transistor; forming a fifth transistor; and forming a sixth transistor. Optionally, a source electrode of the fifth transistor, an active layer of the fifth transistor, a drain electrode of the fifth transistor, a source electrode of the sixth transistor, an active layer of the sixth transistor, a drain electrode of the sixth transistor are formed as parts of a unitary structure in the respective one of the plurality of subpixels. Optionally, the second connecting line is formed to be electrically connected to the drain electrode of the fifth transistor and the drain electrode of the sixth transistor through the fourth via.

In some embodiments, forming a respective one of the plurality of subpixels further includes forming a third connecting line electrically connecting a reset signal line to the semiconductor material layer. Optionally, the method further includes forming a first gate insulating layer on the semiconductor material layer; forming a second gate insulating layer on the first gate insulating layer; and forming an inter-layer dielectric layer on a side of the second gate insulating layer away from the first gate insulating layer. Optionally, the third connecting line is formed on a side of the inter-layer dielectric layer away from the second gate insulating layer. Optionally, the third connecting line is formed to be electrically connected to the semiconductor material layer though a fifth via extending through the inter-layer dielectric layer, the second gate insulating layer, and the first gate insulating layer.

In some embodiments, forming the respective pixel driving circuit of a plurality of pixel driving circuit includes forming a driving transistor; forming a first transistor; forming a second transistor; forming a third transistor; forming a fourth transistor; forming a fifth transistor; and forming a sixth transistor. Optionally, the third connecting line is formed to be electrically connected to a source electrode of the sixth transistor. Optionally, a gate electrode of the sixth transistor is formed to be connected to a reset control signal line. Optionally, a drain electrode of the sixth transistor is formed to be connected to an anode of a respective light emitting element in the respective one of the plurality of subpixels In some embodiments, the method further includes forming a plurality of first voltage supply lines and forming a plurality of second voltage supply lines configured to provide a power voltage signal to the plurality of subpixels. Optionally, the plurality of first voltage supply lines are formed in a same layer as the plurality of first data lines, the plurality of second data lines, the plurality of third data lines, and the plurality of fourth data lines. Optionally, the plurality of first voltage supply lines and a plurality of second voltage supply lines are formed to be substantially parallel to each other. An orthographic projection of a respective one of the plurality of first voltage supply lines on a base substrate is at least partially overlapping with an orthographic projection of a respective one of the plurality of second voltage supply lines on the base substrate. Optionally, the method further includes forming a first planarization layer between the respective one of the plurality of first voltage supply lines and the respective one of the plurality of second voltage supply lines on the base substrate. Optionally, the respective one of the plurality of first voltage supply lines is formed to be connected to the respective one of the plurality of second voltage supply lines through a via extending through the first planarization layer.

In some embodiments, forming a respective one of the plurality of subpixels further includes forming a second interference preventing block configured to be provided with a power voltage signal. Optionally, forming a respective pixel driving circuit of a plurality of pixel driving circuit of the array substrate comprises a storage capacitor comprising a first capacitor electrode and a second capacitor electrode. Optionally, the second interference preventing block and the second capacitor electrode are formed in a same layer. An orthographic projection of the second interference preventing block on a base substrate is at least partially overlapping with an orthographic projection of a semiconductor material layer comprising a part of a respective pixel driving circuit of a plurality of pixel driving circuit on the base substrate.

In some embodiments, forming the respective pixel driving circuit of a plurality of pixel driving circuit includes forming a driving transistor; forming a first transistor; forming a second transistor; forming a third transistor; forming a fourth transistor; forming a fifth transistor; and forming a sixth transistor. Optionally, a source electrode of the third transistor is formed to be electrically connected to the second capacitor electrode through a first connecting line, and electrically connected to a drain electrode of the first transistor. Optionally, the orthographic projection of the second interference preventing block on the base substrate is at least partially overlapping with an orthographic projection of the source electrode of the third transistor on the base substrate.

In some embodiments, the method further includes forming a plurality of first voltage supply lines and forming a plurality of second voltage supply lines configured to provide the power voltage signal to the plurality of subpixels; forming an inter-layer dielectric layer between the plurality of second voltage supply lines and the second interference preventing block, and between the plurality of second voltage supply lines and the second capacitor electrode; and forming a first planarization layer between the plurality of second voltage supply lines and the plurality of first voltage supply lines. Optionally, a respective one of the plurality of second voltage supply lines is formed to be electrically connected to the second interference preventing block through a sixth via extending through the inter-layer dielectric layer.

In some embodiments, the respective one of the plurality of second voltage supply lines is formed to be electrically connected to the second capacitor electrode through a seventh via extending through the inter-layer dielectric layer.

In some embodiments, the method further includes forming a plurality of data line extension protrusions. Optionally, forming the plurality of data line extension protrusions includes forming a respective first data line extension protrusion protruding from the respective first data line into the respective first subpixel, and electrically connecting the respective first data line and a first pixel driving circuit in the respective first subpixel; forming a respective second data line extension protrusion protruding from the respective second data line into the respective second subpixel, and electrically connecting the respective second data line and a second pixel driving circuit in the respective second subpixel; forming a respective third data line extension protrusion protruding from the respective third data line into the respective third subpixel, and electrically connecting the respective third data line and a third pixel driving circuit in the respective third subpixel; and forming a respective fourth data line extension protrusion protruding from the respective fourth data line into the respective fourth subpixel, and electrically connecting the respective fourth data line and a fourth pixel driving circuit in the respective fourth subpixel.

In some embodiments, the respective first data line extension protrusion, the respective second data line extension protrusion, the respective third data line extension protrusion, and the respective fourth data line extension protrusion are in a same layer as the plurality of data lines. Optionally, the method further includes forming a respective first relay electrode in the respective first subpixel; forming a respective second relay electrode in the respective second subpixel; forming a respective third relay electrode in the respective third subpixel; forming a respective fourth relay electrode in the respective fourth subpixel; and forming a first planarization layer between the plurality of data lines and the respective first relay electrode, the respective second relay electrode, the respective third relay electrode, and the respective fourth relay electrode. Optionally, the respective first relay electrode, the respective second relay electrode, the respective third relay electrode, and the respective fourth relay electrode are formed to be respectively connected to the respective first data line extension protrusion, the respective second data line extension protrusion, the respective third data line extension protrusion, and the respective fourth data line extension protrusion respectively through vias respectively extending through the first planarization layer. Optionally, the respective first relay electrode is formed to electrically connect the respective first data line extension protrusion to a semiconductor material layer comprising a part of the first pixel driving circuit. Optionally, the respective second relay electrode is formed to electrically connect the respective second data line extension protrusion to the semiconductor material layer. Optionally, the respective third relay electrode is formed to electrically connect the respective third data line extension protrusion to the semiconductor material layer. Optionally, the respective fourth relay electrode is formed to electrically connect the respective fourth data line extension protrusion to the semiconductor material layer.

In some embodiments, forming the respective pixel driving circuit of a plurality of pixel driving circuit includes forming a driving transistor; forming a first transistor; forming a second transistor; forming a third transistor; forming a fourth transistor; forming a fifth transistor; and forming a sixth transistor. Optionally, the method further includes forming an inter-layer dielectric layer, a second gate insulating layer, and a first gate insulating layer between the semiconductor material layer and the respective first relay electrode, the respective second relay electrode, the respective third relay electrode, the respective fourth relay electrode. Optionally, the respective first relay electrode, the respective second relay electrode, the respective third relay electrode, and the respective fourth relay electrode are formed to be respectively connected to source electrodes of second transistors respectively in the first pixel driving circuit, the second pixel driving circuit, the third pixel driving circuit, and the fourth pixel driving circuit, respectively through vias respectively extending through the interlayer dielectric layer, the second gate insulating layer, and the first gate insulating layer.

In some embodiments, the method further includes forming a plurality of first voltage supply lines and a plurality of second voltage supply lines configured to provide a power voltage signal to the plurality of subpixels. Optionally, the first planarization layer is formed between the plurality of second voltage supply lines and the plurality of first voltage supply lines. Optionally, the plurality of first voltage supply lines are formed in a same layer as the plurality of data lines. Optionally, the plurality of second voltage supply lines are formed in a same layer as the respective first relay electrode, the respective second relay electrode, the respective third relay electrode, and the respective fourth relay electrode.

In some embodiments, the method further includes forming a plurality of reset signal lines in a same layer as the plurality of gate lines. Optionally, the respective second gate line and the respective third gate line are formed between a respective one of the plurality of reset signal lines and the respective first subpixel or the respective fourth subpixel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of subpixels arranged in an array comprising M rows and N columns; wherein the array substrate comprises:
a plurality of first gate lines;
a plurality of second gate lines;
a plurality of third gate lines;
a plurality of fourth gate lines;
a plurality of first data lines;
a plurality of second data lines;
a plurality of third data lines; and
a plurality of fourth data lines;
wherein a respective first gate line of the plurality of first gate lines is configured to provide gate driving signals to subpixels in a (2n−1)-th column, $1 \leq n \leq N/2$ and in a (2m−1)-th row, $1 \leq m \leq M/2$;
a respective second gate line of the plurality of second gate lines is configured to provide gate driving signals to subpixels in the (2n−1)-th column and in a (2m)-th row;
a respective third gate line of the plurality of third gate lines is configured to provide gate driving signals to subpixels in a (2n)-th column and in the (2m)-th row;
a respective fourth gate line of the plurality of fourth gate lines is configured to provide gate driving signals to subpixels in a (2n)-th column and in the (2m−1)-th row;
a respective first data line of the plurality of first data lines is configured to provide data voltage signals to subpixels in the (2n−1)-th column and in the (2m−1)-th row;
a respective second data line of the plurality of second data lines is configured to provide data voltage signals to subpixels in the (2n−1)-th column and in the (2m)-th row;
a respective third data line of the plurality of third data lines is configured to provide data voltage signals to subpixels in the (2n)-th column and in the (2m)-th row; and
a respective fourth data line of the plurality of fourth data lines is configured to provide data voltage signals to subpixels in the (2n)-th column and in a (2m−1)-th row;
wherein the plurality of subpixels comprise:
a respective first subpixel in the (2n−1)-th column and in the (2m−1)-th row;
a respective second subpixel in the (2n−1)-th column and in the (2m)-th row;
a respective third subpixel in the (2n)-th column and in the (2m)-th row; and
a respective fourth subpixel in the (2n)-th column and in the (2m−1)-th row;
wherein the array substrate further comprises:
a respective first subpixel gate line in the respective first subpixel and electrically connected to the respective first gate line;
a respective second subpixel gate line in the respective second subpixel and electrically connected to the respective second gate line;
a respective third subpixel gate line in the respective third subpixel and electrically connected to the respective third gate line;
a respective fourth subpixel gate line in the respective fourth subpixel and electrically connected to the respective fourth gate line;
a first gate insulating layer; and
a second gate insulating layer;
wherein the respective first subpixel gate line, the respective second subpixel gate line, the respective third subpixel gate line, and the respective fourth subpixel gate line are between the first gate insulating layer and the second gate insulating layer; and
the respective first gate line, the respective second gate line, the respective third gate line, and the respective fourth gate line are on a side of the second gate insulating layer away from the respective first subpixel gate line, the respective second subpixel gate line, the respective third subpixel gate line, and the respective fourth subpixel gate line.

2. The array substrate of claim 1, wherein the respective second gate line and the respective third gate line are between the respective first subpixel and the respective second subpixel, and between the respective third subpixel and the respective fourth subpixel;

the respective first gate line and the respective fourth gate line are spaced apart from the respective second gate line and the respective third gate line by the respective first subpixel, and by the respective fourth subpixel;

the respective second data line and the respective third data line are between the respective first subpixel and the respective fourth subpixel, and between the respective second subpixel and the respective third subpixel;

the respective first data line is spaced apart from the respective second data line and the respective third data line by the respective first subpixel, and by the respective second subpixel; and the respective fourth data line is spaced apart from the respective second data line and the respective third data line by the respective third subpixel, and by the respective fourth subpixel.

3. The array substrate of claim 1, wherein a respective pixel driving circuit of a plurality of pixel driving circuit of the array substrate comprises a storage capacitor;

the storage capacitor comprises:

a first capacitor electrode in a same layer as the respective first subpixel gate line, the respective second subpixel gate line, the respective third subpixel gate line, and the respective fourth subpixel gate line; and a second capacitor electrode in a same layer as the respective first gate line, the respective second gate line, the respective third gate line, and the respective fourth gate line.

4. The array substrate of claim 1, further comprising:

a respective first gate line connecting line extending into the respective first subpixel, and electrically connecting the respective first gate line and the respective first subpixel gate line;

a respective second gate line connecting line extending into the respective second subpixel, and electrically connecting the respective second gate line and the respective second subpixel gate line;

a respective third gate line connecting line extending into the respective third subpixel, and electrically connecting the respective third gate line and the respective third subpixel gate line; and a respective fourth gate line connecting line extending into the respective fourth subpixel, and electrically connecting the respective fourth gate line and the respective fourth subpixel gate line.

5. The array substrate of claim 4, further comprising a first gate insulating layer, a second gate insulating layer, and an inter-layer dielectric layer;

wherein the respective first subpixel gate line, the respective second subpixel gate line, the respective third subpixel gate line, and the respective fourth subpixel gate line are between the first gate insulating layer and the second gate insulating layer;

the respective first gate line, the respective second gate line, the respective third gate line, and the respective fourth gate line are on a side of the second gate insulating layer away from the respective first subpixel gate line, the respective second subpixel gate line, the respective third subpixel gate line, and the respective fourth subpixel gate line; and the respective first gate line connecting line, the respective second gate line connecting line, the respective third gate line connecting line, and the respective fourth gate line connecting line are on a side of the inter-layer dielectric layer away from the respective first gate line, the respective second gate line, the respective third gate line, and the respective fourth gate line.

6. The array substrate of claim 3, wherein a respective one of the plurality of subpixels further comprises a first connecting line electrically connected to the first capacitor electrode through a hole in the second capacitor electrode, and electrically connected to a semiconductor material layer comprising a part of a respective pixel driving circuit of a plurality of pixel driving circuit.

7. The array substrate of claim 6, wherein a respective pixel driving circuit of a plurality of pixel driving circuit of the array substrate comprises a storage capacitor comprising a first capacitor electrode and a second capacitor electrode;

an orthographic projection of the second capacitor electrode on a base substrate completely covers, with a margin, an orthographic projection of the first capacitor electrode on the base substrate except for a hole region in which a portion of the second capacitor electrode is absent;

the array substrate further comprises a first gate insulating layer, a second gate insulating layer, and an inter-layer dielectric layer;

the first capacitor electrode is between the first gate insulating layer and the second gate insulating layer;

the second capacitor electrode is between the second gate insulating layer and the inter-layer dielectric layer; and the first connecting line is on a side of the inter-layer dielectric layer away from the second capacitor electrode;

wherein the array substrate further comprises:

a first via in the hole region and extending through the inter-layer dielectric layer and the second gate insulating layer; and a second via extending through the inter-layer dielectric layer, the second gate insulating layer, and the first gate insulating layer;

wherein the first connecting line is connected to the first capacitor electrode through the first via; and the first connecting line is connected to a semiconductor material layer through the second via.

8. The array substrate of claim 6, wherein the respective one of the plurality of subpixels further comprises a first planarization layer on the first connecting line, and a first interference preventing block on a side of the first planarization layer away from the first connecting line;

an orthographic projection of the first interference preventing block on a base substrate is at least partially overlapping with an orthographic projection of the first connecting line on the base substrate; and the first interference preventing block is electrically connected to an anode of a respective light emitting element in the respective one of the plurality of subpixels, and electrically connected to the semiconductor material layer.

9. The array substrate of claim 8, wherein the respective one of the plurality of subpixels further comprises a second connecting line electrically connecting the first interference preventing block and the semiconductor material layer;

the first connecting line and the second connecting line are in a same layer;

the first interference preventing block is electrically connected to the second connecting line through a third via extending through the first planarization layer;

the array substrate further comprises a first gate insulating layer, a second gate insulating layer, and an inter-layer dielectric layer; and the second connecting line is electrically connected to the semiconductor material layer through a fourth via extending through the inter-layer dielectric layer, the second gate insulating layer, and the first gate insulating layer.

10. The array substrate of claim 6, wherein a respective one of the plurality of subpixels further comprises a third connecting line electrically connecting a reset signal line to the semiconductor material layer.

11. The array substrate of claim 10, further comprising:
a first gate insulating layer on the semiconductor material layer;
a second gate insulating layer on the first gate insulating layer; and
an inter-layer dielectric layer on a side of the second gate insulating layer away from the first gate insulating layer;
wherein the third connecting line is on a side of the inter-layer dielectric layer away from the second gate insulating layer;
the third connecting line is electrically connected to the semiconductor material layer though a fifth via extending through the inter-layer dielectric layer, the second gate insulating layer, and the first gate insulating layer.

12. An array substrate, comprising a plurality of subpixels arranged in an array comprising M rows and N columns;
wherein the array substrate comprises:
a plurality of first gate lines;
a plurality of second gate lines;
a plurality of third gate lines;
a plurality of fourth gate lines;
a plurality of first data lines;
a plurality of second data lines;
a plurality of third data lines; and
a plurality of fourth data lines;
wherein a respective first gate line of the plurality of first gate lines is configured to provide gate driving signals to subpixels in a (2n−1)-th column, 1≤n≤N/2 and in a (2m−1)-th row, 1≤m≤M/2;
a respective second gate line of the plurality of second gate lines is configured to provide gate driving signals to subpixels in the (2n−1)-th column and in a (2m)-th row;
a respective third gate line of the plurality of third gate lines is configured to provide gate driving signals to subpixels in a (2n)-th column and in the (2m)-th row;
a respective fourth gate line of the plurality of fourth gate lines is configured to provide gate driving signals to subpixels in a (2n)-th column and in the (2m−1)-th row;
a respective first data line of the plurality of first data lines is configured to provide data voltage signals to subpixels in the (2n−1)-th column and in the (2m−1)-th row;
a respective second data line of the plurality of second data lines is configured to provide data voltage signals to subpixels in the (2n−1)-th column and in the (2m)-th row;
a respective third data line of the plurality of third data lines is configured to provide data voltage signals to subpixels in the (2n)-th column and in the (2m)-th row; and a respective fourth data line of the plurality of fourth data lines is configured to provide data voltage signals to subpixels in the (2n)-th column and in a (2m−1)-th row;
wherein the plurality of subpixels comprise:
a respective first subpixel in the (2n−1)-th column and in the (2m−1)-th row;
a respective second subpixel in the (2n−1)-th column and in the (2m)-th row;
a respective third subpixel in the (2n)-th column and in the (2m)-th row; and
a respective fourth subpixel in the (2n)-th column and in the (2m−1)-th row;
wherein the array substrate further comprises a plurality of first voltage supply lines and a plurality of second voltage supply lines configured to provide a power voltage signal to the plurality of subpixels;
wherein the plurality of first voltage supply lines are in a same layer as the plurality of first data lines, the plurality of second data lines, the plurality of third data lines, and the plurality of fourth data lines;
the plurality of first voltage supply lines and a plurality of second voltage supply lines are substantially parallel to each other; and
an orthographic projection of a respective one of the plurality of first voltage supply lines on a base substrate is at least partially overlapping with an orthographic projection of a respective one of the plurality of second voltage supply lines on the base substrate;
wherein the array substrate further comprises a first planarization layer between the respective one of the plurality of first voltage supply lines and the respective one of the plurality of second voltage supply lines on the base substrate; and
the respective one of the plurality of first voltage supply lines is connected to the respective one of the plurality of second voltage supply lines through a via extending through the first planarization layer.

13. An array substrate, comprising a plurality of subpixels arranged in an array comprising M rows and N columns;
wherein the array substrate comprises:
a plurality of first gate lines;
a plurality of second gate lines;
a plurality of third gate lines;
a plurality of fourth gate lines;
a plurality of first data lines;
a plurality of second data lines;
a plurality of third data lines; and
a plurality of fourth data lines;
wherein a respective first gate line of the plurality of first gate lines is configured to provide gate driving signals to subpixels in a (2n−1)-th column, 1≤n≤N/2 and in a (2m−1)-th row, 1≤m≤M/2;
a respective second gate line of the plurality of second gate lines is configured to provide gate driving signals to subpixels in the (2n−1)-th column and in a (2m)-th row;
a respective third gate line of the plurality of third gate lines is configured to provide gate driving signals to subpixels in a (2n)-th column and in the (2m)-th row;
a respective fourth gate line of the plurality of fourth gate lines is configured to provide gate driving signals to subpixels in a (2n)-th column and in the (2m−1)-th row;
a respective first data line of the plurality of first data lines is configured to provide data voltage signals to subpixels in the (2n−1)-th column and in the (2m−1)-th row;

a respective second data line of the plurality of second data lines is configured to provide data voltage signals to subpixels in the (2n−1)-th column and in the (2m)-th row;

a respective third data line of the plurality of third data lines is configured to provide data voltage signals to subpixels in the (2n)-th column and in the (2m)-th row; and a respective fourth data line of the plurality of fourth data lines is configured to provide data voltage signals to subpixels in the (2n)-th column and in a (2m−1)-th row;

wherein the plurality of subpixels comprise:

a respective first subpixel in the (2n−1)-th column and in the (2m−1)-th row;

a respective second subpixel in the (2n−1)-th column and in the (2m)-th row;

a respective third subpixel in the (2n)-th column and in the (2m)-th row; and a respective fourth subpixel in the (2n)-th column and in the (2m−1)-th row;

wherein a respective one of the plurality of subpixels further comprises a second interference preventing block configured to be provided with a power voltage signal;

a respective pixel driving circuit of a plurality of pixel driving circuit of the array substrate comprises a storage capacitor comprising a first capacitor electrode and a second capacitor electrode;

the second interference preventing block and the second capacitor electrode are in a same layer; and an orthographic projection of the second interference preventing block on a base substrate is at least partially overlapping with an orthographic projection of a semiconductor material layer comprising a part of a respective pixel driving circuit of a plurality of pixel driving circuit on the base substrate.

14. The array substrate of claim 13, further comprising:

a plurality of first voltage supply lines and a plurality of second voltage supply lines configured to provide the power voltage signal to the plurality of subpixels;

an inter-layer dielectric layer between the plurality of second voltage supply lines and the second interference preventing block, and between the plurality of second voltage supply lines and the second capacitor electrode; and a first planarization layer between the plurality of second voltage supply lines and the plurality of first voltage supply lines;

wherein a respective one of the plurality of second voltage supply lines is electrically connected to the second interference preventing block through a sixth via extending through the inter-layer dielectric layer.

15. The array substrate of claim 14, wherein the respective one of the plurality of second voltage supply lines is electrically connected to the second capacitor electrode through a seventh via extending through the inter-layer dielectric layer.

16. The array substrate of claim 1, further comprising:

a respective first data line extension protrusion protruding from the respective first data line into the respective first subpixel, and electrically connecting the respective first data line and a first pixel driving circuit in the respective first subpixel;

a respective second data line extension protrusion protruding from the respective second data line into the respective second subpixel, and electrically connecting the respective second data line and a second pixel driving circuit in the respective second subpixel;

a respective third data line extension protrusion protruding from the respective third data line into the respective third subpixel, and electrically connecting the respective third data line and a third pixel driving circuit in the respective third subpixel; and a respective fourth data line extension protrusion protruding from the respective fourth data line into the respective fourth subpixel, and electrically connecting the respective fourth data line and a fourth pixel driving circuit in the respective fourth subpixel.

17. The array substrate of claim 16, wherein the respective first data line extension protrusion, the respective second data line extension protrusion, the respective third data line extension protrusion, and the respective fourth data line extension protrusion are in a same layer as the plurality of data lines;

the array substrate further comprises:

a respective first relay electrode in the respective first subpixel;

a respective second relay electrode in the respective second subpixel;

a respective third relay electrode in the respective third subpixel;

a respective fourth relay electrode in the respective fourth subpixel; and a first planarization layer between the plurality of data lines and the respective first relay electrode, the respective second relay electrode, the respective third relay electrode, and the respective fourth relay electrode;

wherein the respective first relay electrode, the respective second relay electrode, the respective third relay electrode, and the respective fourth relay electrode are respectively connected to the respective first data line extension protrusion, the respective second data line extension protrusion, the respective third data line extension protrusion, and the respective fourth data line extension protrusion respectively through vias respectively extending through the first planarization layer;

the respective first relay electrode electrically connects the respective first data line extension protrusion to a semiconductor material layer comprising a part of the first pixel driving circuit;

the respective second relay electrode electrically connects the respective second data line extension protrusion to the semiconductor material layer;

the respective third relay electrode electrically connects the respective third data line extension protrusion to the semiconductor material layer;

the respective fourth relay electrode electrically connects the respective fourth data line extension protrusion to the semiconductor material layer.

18. A display apparatus, comprising the array substrate of claim 1, and an integrated circuit connected to the array substrate.

* * * * *